(12) United States Patent
Wesström et al.

(10) Patent No.: US 6,763,165 B1
(45) Date of Patent: Jul. 13, 2004

(54) GRATING ASSISTED COUPLER WITH CONTROLLED START

(75) Inventors: Jan-Olof Wesström, Stockholm (SE); Lennart P. O. Lundqvist, Kista (SE)

(73) Assignee: ADC Telecommunications, Inc., Eden Prairie, MN (US)

( * ) Notice: Subject to any disclaimer, the term of this patent is extended or adjusted under 35 U.S.C. 154(b) by 373 days.

(21) Appl. No.: 10/050,329

(22) Filed: Jan. 15, 2002

(51) Int. Cl.[7] .............................. G02B 6/34; G02F 1/295
(52) U.S. Cl. .............................. 385/37; 385/41; 385/9; 385/10
(58) Field of Search .............................. 385/37, 41, 31, 385/39, 40, 9, 8, 10, 2, 50; 372/50

(56) References Cited

U.S. PATENT DOCUMENTS

| | | | | |
|---|---|---|---|---|
| 4,533,207 A | * | 8/1985 | Alferness | 385/40 |
| 5,140,149 A | * | 8/1992 | Sakata et al. | 257/436 |
| 5,517,589 A | * | 5/1996 | Takeuchi | 385/24 |
| 5,613,020 A | * | 3/1997 | Uchida et al. | 385/9 |
| 5,621,828 A | | 4/1997 | Baets et al. | |
| 5,699,378 A | * | 12/1997 | Lealman et al. | 372/102 |
| 5,937,129 A | * | 8/1999 | Jeong et al. | 385/129 |
| 6,064,685 A | * | 5/2000 | Bissessur et al. | 372/102 |
| 6,101,302 A | * | 8/2000 | Park et al. | 385/37 |
| 6,198,863 B1 | * | 3/2001 | Lealman et al. | 385/37 |
| 6,363,188 B1 | * | 3/2002 | Alphonse | 385/37 |
| 6,549,708 B2 | * | 4/2003 | Worchesky et al. | 385/37 |
| 6,665,474 B2 | * | 12/2003 | Wesstrom | 385/40 |
| 6,674,944 B2 | * | 1/2004 | Lundqvist | 385/50 |

* cited by examiner

*Primary Examiner*—Frank G. Font
*Assistant Examiner*—Layla Lauchman
(74) *Attorney, Agent, or Firm*—Carlson, Caspers, Vandenburgh & Lindquist

(57) ABSTRACT

In a grating-assisted coupler, the mode of the first waveguide of the coupler may include some electric field in the second waveguide, with the effect that when light lasses from an input waveguide to the first waveguide, some light is launched, or injected, directly into the mode of the second waveguide. This injected light may or may not be in phase with the light subsequently coupled into the side of the second waveguide from the first waveguide via grating assistance. The grating structure is formed to ensure a desired phase relationship between the injected light and the grating coupled light: under certain conditions of relative phase, the transmission through the coupler may be increased and the bandwidth may be reduced.

42 Claims, 15 Drawing Sheets

GRATING ASSISTED COUPLER WITH CONTROLLED START

FIELD OF THE INVENTION

The present invention is directed to an integrated optical device, and more particularly to an improved grating assisted, directional coupler.

BACKGROUND

Many different types of integrated optical devices use waveguide couplers to couple light from one waveguide to another. One particular type of waveguide coupler is a grating-assisted coupler, which is often used as a transmission filter. In a grating-assisted coupler, the two waveguides have different effective refractive indices, and a grating close to one or both of the waveguides is used to phase match the coupling of light from one waveguide to the other.

The bandwidth of a grating-assisted coupler is typically inversely proportional to its length, and so a longer grating-assisted coupler generally results in a smaller transmission bandwidth. Smaller bandwidths are desirable in certain applications, for example when used as a frequency selective element with a semiconductor laser. On the other hand, the grating introduces scattering losses and longer couplers may suffer from higher loss than shorter couplers. Therefore, a compromise is often made between transmission losses and bandwidth. It is important, therefore, that the coupler operate optimally so that the best combination of bandwidth and transmission loss may be obtained.

SUMMARY OF THE INVENTION

Generally, the present invention relates to an approach to improving the operation of a grating-assisted coupler. In particular, the mode of the first waveguide of the coupler may include some electric field in the second waveguide, with the effect that when light passes from an input waveguide to the first waveguide, some light is launched, or injected, directly into the mode of the second waveguide. This injected light may or may not be in phase with the light subsequently coupled into the side of the second waveguide from the first waveguide via grating assistance. The grating structure is formed to ensure a desired phase relationship between the injected light and the grating coupled light: under certain conditions of relative phase, the transmission through the coupler may be increased and the bandwidth may be reduced.

In one particular embodiment, the invention is direction to a grating-assisted coupler device that includes a first input/output (i/o) waveguide and a coupler unit. The coupler unit has a first coupler waveguide coupled at a first end to the first i/o waveguide, and a second coupler waveguide disposed proximate the first coupler waveguide. Light propagating from the first i/o waveguide into the coupler unit launches a first portion of light into the first coupler waveguide and a second portion of light into the second coupler waveguide. A grating structure is disposed proximate at least one of the first and second coupler waveguides to couple light from the first coupler waveguide to the second coupler waveguide. The grating structure includes a periodic structure having a starting end proximate the starting end of the second coupler waveguide and positioned so that the light coupled by the grating structure into the second coupler waveguide from the first coupler waveguide is substantially in phase with the second portion of light launched into the second coupler waveguide.

Another embodiment of the invention is directed to a laser having a gain region including a gain waveguide, and a coupler region including a first coupler waveguide coupled at a first end to the gain waveguide. The coupler region also includes a second coupler waveguide proximate the first coupler waveguide. Light propagating from the gain waveguide into the coupler region launches a first portion of light into the first coupler waveguide and a second portion of light into the second coupler waveguide. A grating structure is disposed proximate at least one of the first and second coupler waveguides to couple light from the first coupler waveguide to the second coupler waveguide. The grating structure includes a periodic structure having a starting end proximate the starting end of the second coupler waveguide and positioned so that the light coupled by the grating structure into the second coupler waveguide from the first coupler waveguide is substantially in phase with the second portion of light launched into the second coupler waveguide. A reflector region has a reflector waveguide coupled to receive light from the second coupler waveguide.

Another embodiment of the invention is directed to a an optical communications system that has an optical transmitter having at least one laser, a fiber optic link coupled to receive light signals output from the optical transmitter, and an optical receiver unit coupled to detect the light signals from the fiber optic link. The at least one laser includes a gain region including a gain waveguide and a coupler region having a first coupler waveguide coupled at a first end to the gain waveguide. The coupler region also has a second coupler waveguide disposed proximate the first coupler waveguide. Light propagating from the gain waveguide into the coupler unit launches a first portion of light into the first coupler waveguide and a second portion of light into the second coupler waveguide. A grating structure is disposed proximate at least one of the first and second coupler waveguides to couple light from the first coupler waveguide to the second coupler waveguide. The grating structure includes a periodic structure having a starting end proximate the starting end of the second coupler waveguide and positioned so that the light coupled by the grating structure into the second coupler waveguide from the first coupler waveguide is substantially in phase with the second portion of light launched into the second coupler waveguide. The laser also includes a reflector region having a reflector waveguide coupled to receive light from the second coupler waveguide.

Another embodiment of the invention is directed to a method of forming a coupler that includes forming a first coupler waveguide in a coupler region and forming a second coupler waveguide in the coupler region over the first coupler waveguide. A grating structure is formed proximate one of the first and second coupler waveguides. The grating structure includes a periodic structure having a starting end positioned relative to a starting end of the second coupler waveguide so that light coupled by the grating structure from the first coupler waveguide into the second coupler waveguide is substantially in phase with light injected into the starting end of the second coupler waveguide when passing light into a starting end of the first coupler waveguide.

The above summary of the present invention is not intended to describe each illustrated embodiment or every Implementation of the present invention. The following figures and detailed description more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
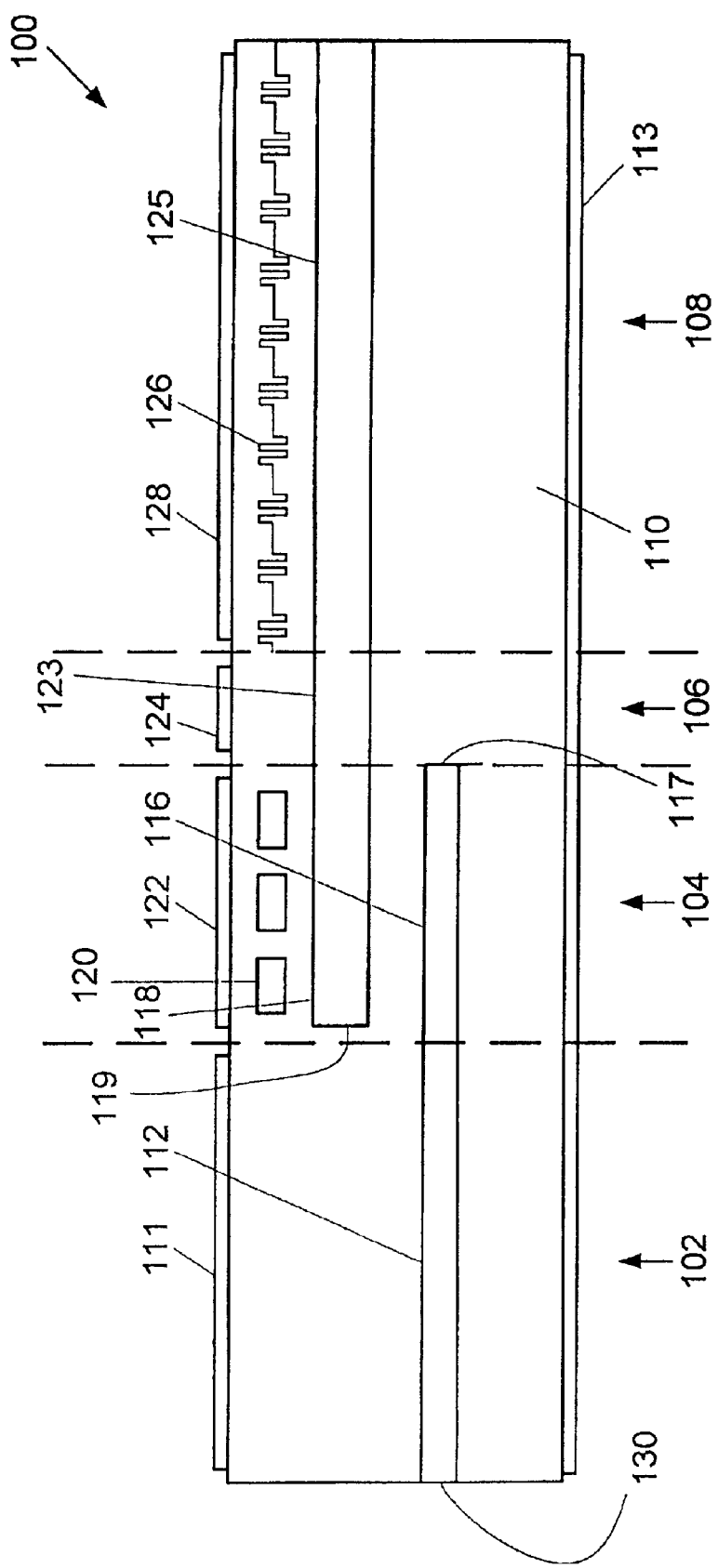
FIG. 1 schematically illustrates an embodiment of a semiconductor laser that uses a grating assisted coupler according to the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives failing within the spirit and scope of the invention as defined by the appended claims.

DETAILED DESCRIPTION

The present invention is applicable to integrated optical devices and is believed to be particularly useful for improving the performance of grating-assisted couplers.

Grating-assisted couplers typically have two single mode waveguides, closely spaced from each other. The waveguides generally have different effective refractive indices, and so light travelling in one waveguide has a momentum different from light travelling in the other waveguide. A grating disposed proximate at least one of the waveguides provides phase matching to permit light from one waveguide to couple into the other.

The bandwidth of the coupler is related to how fast the phase matching is destroyed when the frequency of the light is changed, and so the bandwidth is inversely proportional to the frequency derivative of the difference between the propagation constants of the two waveguides, $$\frac{\partial \beta}{\partial \omega}.$$

Since the relation $$\frac{\partial \beta}{\partial \omega} = \frac{1}{v_g} = \frac{n_g}{c}$$

holds, where $v_g$ is the group velocity and $n_g$ is the group refractive index, the bandwidth is inversely proportional to the difference in effective group index between the two waveguides. Without the grating, coupling occurs where the waveguides have very similar effective indices: the group indices are also similar and so the transmission bandwidth of the coupler is large. Therefore, the grating is advantageous for increasing the frequency selectivity of the coupler by reducing the transmission bandwidth.

Grating-assisted couplers find use in different types of optical devices, including semiconductor lasers. One particular example of the use of a grating-assisted coupler is illustrated in FIG. 1A, which shows a grating coupled, sampled reflector (GCSR) laser 100, for example as is described in greater detail in "74 nm Wavelength Tuning Range of an InGaAsP Vertical Grating Assisted Codirectional Coupler Laser with Rear Sampled Grating Reflector" by M. Oberg et al., IEEE Photonics Technology Letters, Vol. 5, No. 7, pp. 735–738, July 1993, incorporated herein by reference, and in U.S. Pat. No. 5,621,828, also incorporated herein by reference.

The laser 100 includes four sections, a gain section 102, a coupler section 104, a phase section 106 and a reflector section 108, each typically integrated on the same substrate 110. The gain section 102 includes an active waveguide 112, and may Include a quantum well structure to provide optical gain. A gain electrode 111 is disposed over the gain section 102 to permit injection of current through the gain section 102. A common electrode 113 is typically disposed over the bottom surface of the substrate 110.

The waveguide 112 extends into the coupler section 104 as a first waveguide 116. A second waveguide 118 lies close to the first waveguide 116. A grating structure 120 is disposed near the second waveguide 118. The grating structure 120 is illustrated above the second waveguide 118, but may optionally also be placed between the first and second waveguides 116 and 118, or below the first waveguide 116. A coupler electrode 122 is disposed over the coupler section 104 to permit injection of current through the coupler section 104.

The second waveguide 118 couples to a phase waveguide 123 through the phase section 106 and into the reflector section 108. A phase-electrode 124 is disposed over the phase section 106 to permit injection of current through the phase section 106.

The reflector section 108 includes a reflector structure 126 disposed near the reflector waveguide 125 that is coupled to receive light from the phase waveguide 123. In the illustrated embodiment, the reflector structure is a sampled Bragg reflector, although the reflector structure 126 may be any type of reflector structure that provides the desired reflective characteristics. A reflector electrode 128 is disposed over the reflector section 108 to permit injection of current through the reflector section 108.

The GCSR laser 100 is able to produce light in a single longitudinal mode that is widely tunable over a large wavelength range, and is particularly suitable for use as a source in dense wavelength multiplexed (DWDM) optical communications systems. The laser cavity is formed between the output facet 130 and the reflector section 108. In other embodiments, not illustrated, the output coupler of the laser 100 may be a wideband Bragg reflector, as is described further in U.S. patent application Ser. No. 09/915,046, incorporated herein by reference.

Figure 1B:
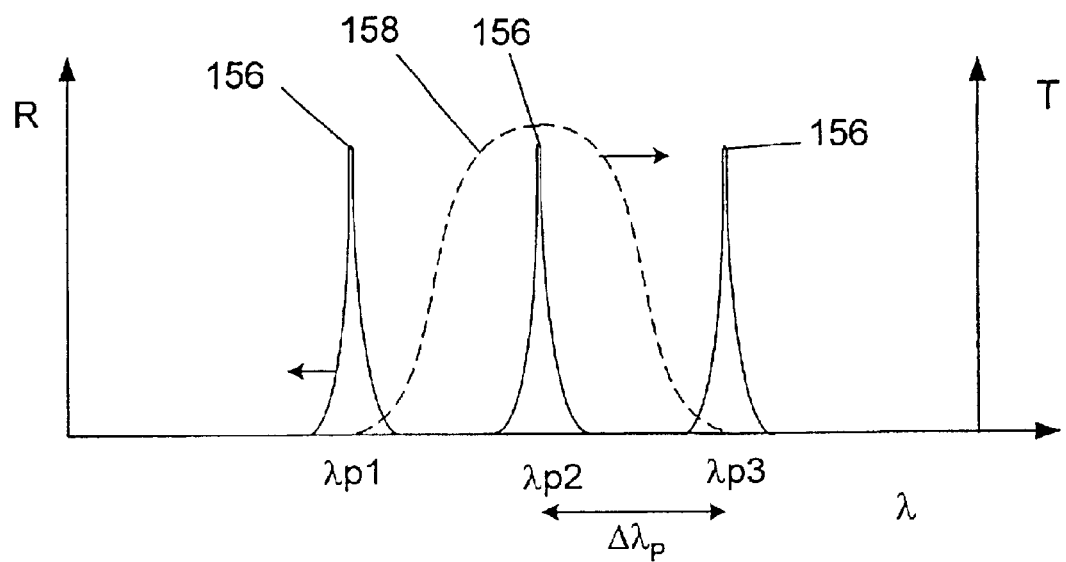

The laser cavity is frequency selective: the reflector section 108 typically has a reflectivity spectrum that includes a number of highly reflecting peaks 156, illustrated in FIG. 1B, separated by regions of wavelength where the reflectivity is low. In the particular embodiment illustrated in FIG. 1B, the separation between the different reflection peaks 156 is $\Delta\lambda_p$. The coupler section 104 has a relatively broad transmission spectrum 158, which is wavelength tunable by injecting different amounts of current via the coupler electrode 122. Therefore, the transmission window 158 of the coupler section 104 may be tuned to select a single reflection peak 156 of the reflector section 108, thus selecting a single longitudinal mode for oscillation. Since the reflectivity peaks 156 of the reflector section 108 are also wavelength tunable by injecting different amounts of current through the reflector electrode 128, the laser 100 may be made to oscillate on a single longitudinal mode at substantially any selected wavelength within the operating wavelength range. The oscillating wavelength may be fine-tuned by adjusting the current injected through the phase section 106 via the phase electrode 124.

For a laser used as a source in optical communications having a wavelength in the range 1500–1620 nm, a typical wavelength range for long-haul fiber optic communications, the laser 100 may be based on indium phosphide (InP), having an InP substrate. The waveguides 116 and 118 are typically formed of a material having a higher refractive Index than the surrounding material, in order to provide optical confinement. The waveguides 116 and 118 may be, for example, formed from an indium gallium arsenide phosphide (InGaAsP) alloy. The grating structure 120 is also typically formed from islands 130 of high refractive material spaced apart in a repetitive pattern, and may also be formed from InGaAsP.

An important part of the GCSR laser 100 is the coupler region 104, which is used as a transmission filter to select the desired reflectivity peak of the reflector section 108. For light propagating within the laser 100 from left to right, the grating-assisted coupler transfers optical power from the first waveguide 116 to the second waveguide 118. Likewise, for light propagating within the laser 100 from right to left, the coupler transfers optical power from the second waveguide 118 to the first waveguide 116. It will be appreciated that the filtering function performed by the grating-assisted coupler is not unique for use in a laser and a grating-assisted coupler may also be used as a transmission filter in other types of optical devices.

For a given coupler length, L, the grating strength may be adjusted so that a single pass through the coupler results in the transfer of the maximum amount of light from one waveguide to the other. The coupling length may be defined as that length of coupler that results in the transfer of the maximum amount of power from one waveguide to the other. If the coupling length is too long, then power transfer is not complete on a single pass through the coupler, and the laser efficiency falls. If the coupling length is too short, then some of the power that was transferred from the one waveguide to the other is then transferred back to the original waveguide, also reducing the effective transmission through the coupler.

Figure 2:
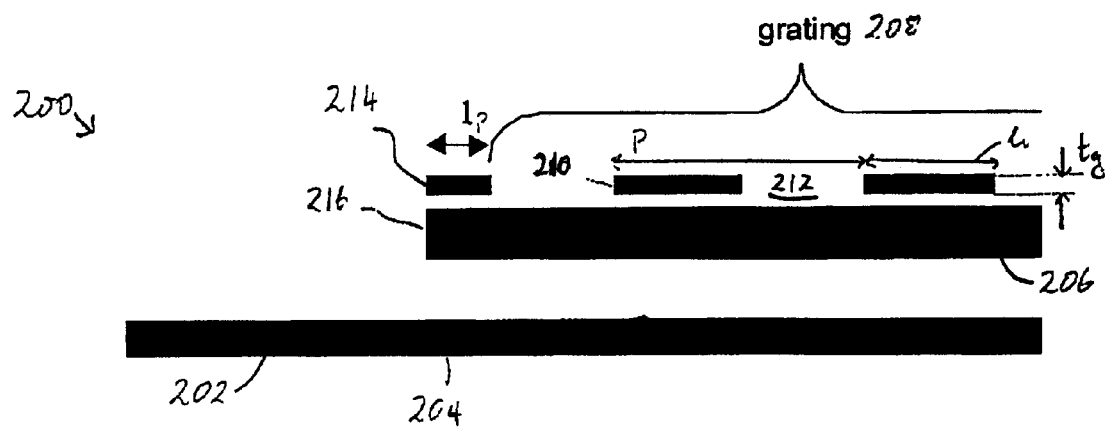
FIG. 2 schematically illustrates an embodiment of a grating assisted coupler according to the present invention.

An important feature of a grating-assisted coupler is the relative positioning of the start of the waveguide into which the light is to be coupled and the start of the grating. An exemplary grating-assisted coupler 200 is illustrated in FIG. 2, which shows an input waveguide 202 coupled to the first waveguide 204 of the coupler 200. The input waveguide 202 may be, for example, the active waveguide of a gain section of a laser.

The second waveguide 206 Is disposed close to the first waveguide 204. The dimensions, particularly width and height, of the second waveguide 206 need not be the same as those of the first waveguide 204. A grating 208 is disposed near the second waveguide 206. The grating 208 includes a periodic variation in the refractive index of the material close to the second waveguide 206. The grating 208 may also be positioned between the first and second waveguides 204 and 206, or on the other side of the first waveguide 204 from the second waveguide 206. In one embodiment, the grating 208 is formed by repeated sections of grating layer 210 that includes a pattern of islands of a first refractive index disposed within material 212 of a second refractive index. The grating layer 210 may be formed of a material similar to the material used to form the first waveguide 204 and/or the second waveguide 206. It is useful to define a duty cycle for the grating 208, which is defined as the length, $l_i$ of the grating layer section divided by the period of the structure, P. The thickness of the grating layer 210 is designated as $t_g$. Typically, the grating provides greater coupling assistance when the value of $t_g$ is increased. On the other hand, the scattering losses for the optical power propagating along the second waveguide 206 increase with increased values of $t_g$, so a compromise is often made between improved coupling and coupler loss.

The grating 208 may also include a lead-in structure 214 disposed proximate the beginning of the second waveguide 206. The lead-in structure 214 is typically formed to have a local variation in the refractive index, for example in a manner similar to the repetitive islands of the grating layer. The lead-in structure 214 has a length $l_p$.

In some situations, the match between the mode in the input waveguide 202 and the mode of the first waveguide 204 is poor, for example where these waveguides 202 and 204 have different heights or widths. A superposition of modes in the first and second waveguides 204 and 206 may better match the mode of the light propagating in the input waveguide 202. Accordingly, the mode in the input waveguide 202 may excite a superposition of the modes in the first and second waveguides 204 and 206. Thus, light entering the first waveguide 204 from the input waveguide 202 propagates in an optical mode predominantly in the first waveguide 204, but which also has some field in the second waveguide 206, and so a fraction of the propagating optical power, typically a few percent, is effectively launched, or injected, into the second waveguide 206 close to its starting end 216. This is referred to as injected light. The phasing of the grating 208 relative to the start of the second waveguide 206 determines the phase of light coupled by the grating into the second waveguide 206, relative to the phase of the light injected at the end 216. The light that is coupled into the second waveguide by the grating is referred to as grating-coupled light.

Figure 3:
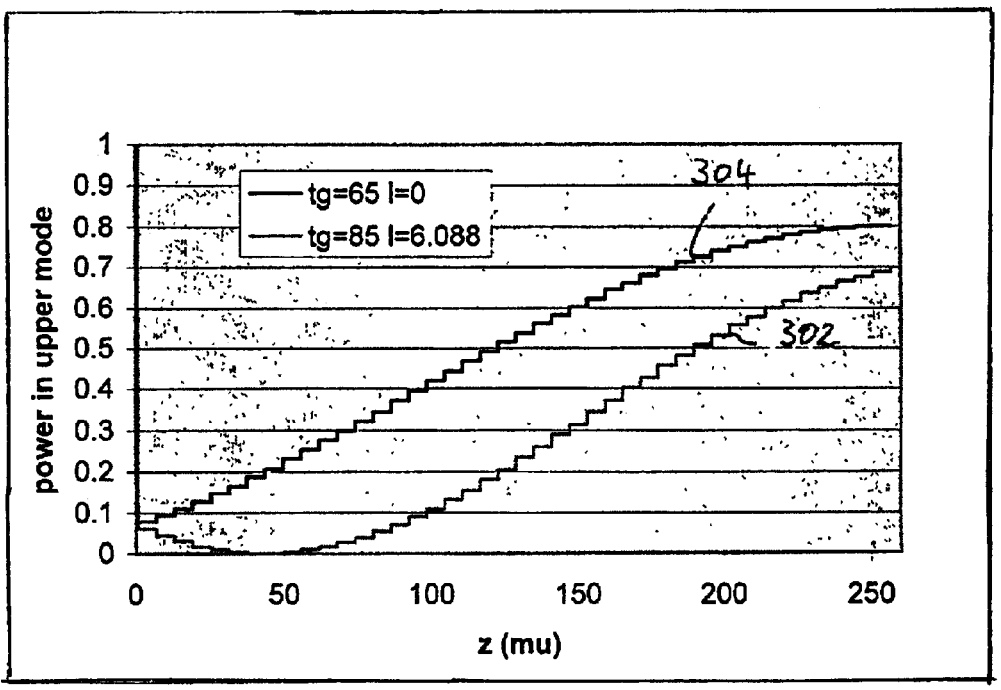
FIG. 3 presents a graph showing coupled optical power as a function of position along a grating assisted coupler.

FIG. 3 shows a graph of the calculated optical power in the second waveguide 206 as a function of position along the second waveguide, for various values of the relative phase between the injected light and the grating-coupled light. The values of the power in the second waveguide are shown normalized to the optical power launched into the first waveguide 204, ignoring absorption losses. The length, $l_p$, of the lead-in structure 214 is preferably selected so that the injected light is in phase with the grating-coupled light within the second waveguide.

For the first curve 302, the value of $l_p$ is equal to 6.1 µm, one half of the grating period, and the grating height, $t_g$, is 85 nm. In the second curve, 304, the value of $l_p$ is zero and the grating height, $t_g$, is 65 nm. Both curves 302 and 304 are calculated with the same value of power injected at the start of the second waveguide 206, approximately 6%. The second curve 304 rises to a maximum power of about 0.8 over the length of the coupler (250 µm). On the other hand, the first curve 302 first dips to approximately zero at about 45 µm before rising to a maximum value of about 0.7 at the end of the coupler. The growth of the first curve 302 is different from that of the second curve 304 because of the difference in the length, $l_p$, of the lead-in structure 214, which changes the phase of the injected light relative to the phase of the coupled light. Moreover, the first curve 302 does not rise to as a high a value as the second curve 304, even though the thicker grating results in enhanced coupling. Even if the coupler were to be extended in length beyond 250 µm, the first curve 302 would still not rise as high as the second curve 304, due to the increased losses arising from the greater value of $t_g$.

These results show the importance of selecting the correct starting conditions for the grating 208 relative to the second waveguide 206, so as to select the correct relative phasing between the injected light and the grating-coupled light. For a particular length of coupler, where the injected light is in phase with the coupled light, the coupling coefficient can be reduced, which means that the grating layer thickness may be reduced. This results in a reduction of the scattering loss caused by the grating, and permits higher light transmission through the coupler.

The length, $l_p$, of the lead-in structure 214 is selectable and may take on different values. For the embodiment of grating structure 208 illustrated in FIG. 2, optimal phasing between the injected light and the grating-coupled light is obtained with $l_p$=mP, where m is an integer value 0, 1, 2, 3, etc., and P is the period of the grating 208. Other lengths of lead-in structure may be used to select the relative phase of the injected light and the grating-coupled light, depending on the particular grating structure employed. Preferably, the injected light has the same phase as the grating-coupled light, within the second waveguide. For example, the different embodiments of grating structure are described below.

Figure 4:
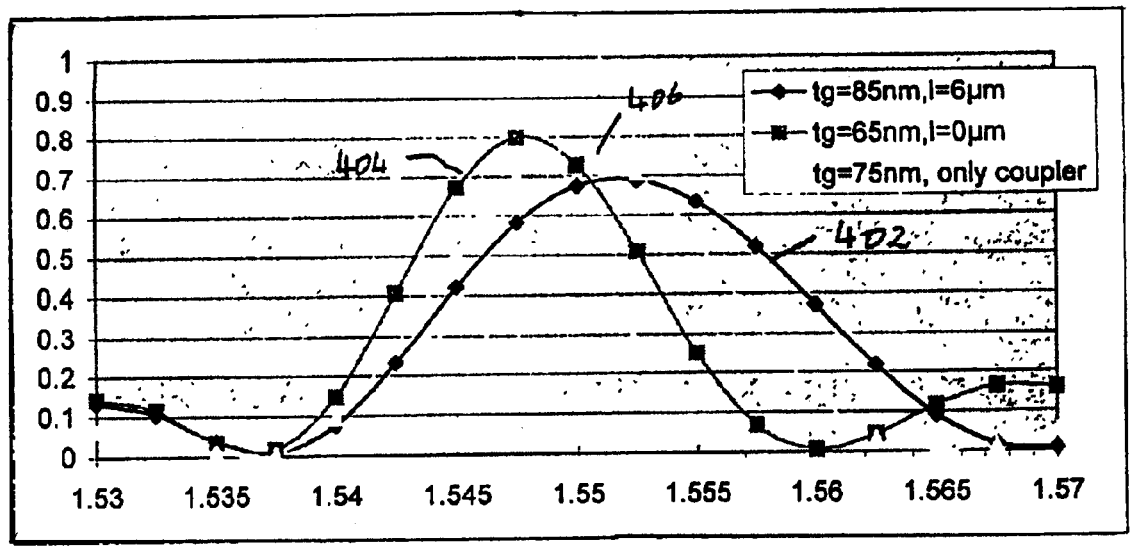
FIG. 4 presents a graph showing the transmission spectrum of a coupler under different grating boundary conditions.

The transmission through the coupler illustrated in FIG. 2 is shown in the graph in FIG. 4 as a function of wavelength. The first curve 402 shows the transmission through the coupler for the grating structure assumed to generate curve 302, while the second curve 404 shows the transmission through the coupler for the grating structure that provided curve 304. Also, a third curve 406 is presented to show the transmission of light through the coupler when considering only light coupled from the first waveguide 204 to the second waveguide 206, ignoring the light initially launched into the second waveguide 206 at its start 216.

In addition to having the lowest peak transmission, the first curve 402 also has the broadest transmission bandwidth, 16.5 nm (FWHM). The second curve 404 demonstrates the highest peak transmission and the narrowest bandwidth, 11.11 nm. The third curve 406 has a peak transmission higher than that of the first curve 402 but not as high as that of the second curve 404. The transmission bandwidth of the third curve is 13.1 nm.

Thus, the condition of matched phase between the injected and coupled light also results in reduced coupler bandwidth, giving enhanced frequency selectivity. When designing a grating-assisted coupler, there is a trade-off between bandwidth and length. Bandwidth is typically inversely proportional to coupler length, and coupler length is usually increased to reduce the bandwidth. On the other hand, a longer grating results in increased scattering losses. The realization that optimizing the relative phases of the injected light and the coupled light results in an improvement in bandwidth without increasing the length of coupler, and so the reduced bandwidth is achieved at no cost in transmission losses. Furthermore, the coupler may be reduced in length to achieve the same bandwidth, thus reducing the length of the grating and increasing the transmission through the coupler.

Another advantage that arises from controlling the relative phases of the injected light and the coupled light is that the separation between the waveguides may be reduced. Where the relative phase of the injected and coupled light is not known, and is therefore uncontrolled, the amount of light injected into the second waveguide is normally kept low, in order to reduce the possibly undesirable effects that arise when the injected light is out of phase with the coupled light. In such a case, the second waveguide should be placed relatively far from the first waveguide, which leads to the use of a relatively thick grating. On the other hand, when the relative phases of the injected and coupled light are controlled, the second waveguide may be placed closer to the first waveguide, which reduces the thickness of the grating that is needed to assist the coupling. This leads to a reduction in the coupler losses, and so the optical transmission through the coupler is increased.

The sidelobes of the grating-assisted cases (curves 402 and 404) are higher than the sidelobes of the case illustrated for curve 406. The sidelobes of curves 402 and 404, however, do not rise above about 0.15. Such a sidelobe value is, where the coupler is used in a GCSR, still sufficiently low that the wavelength discrimination in the laser produces a single mode centered on a single reflection peak.

As illustrated in FIGS. 3 and 4, optimum operation is achieved where $l_p$ is zero, and so the grating starts with a half period without the grating layer 210. It is also possible to have a lead-in structure present at the start of the second waveguide 206, rather than no lead-in structure.

Figure 5:
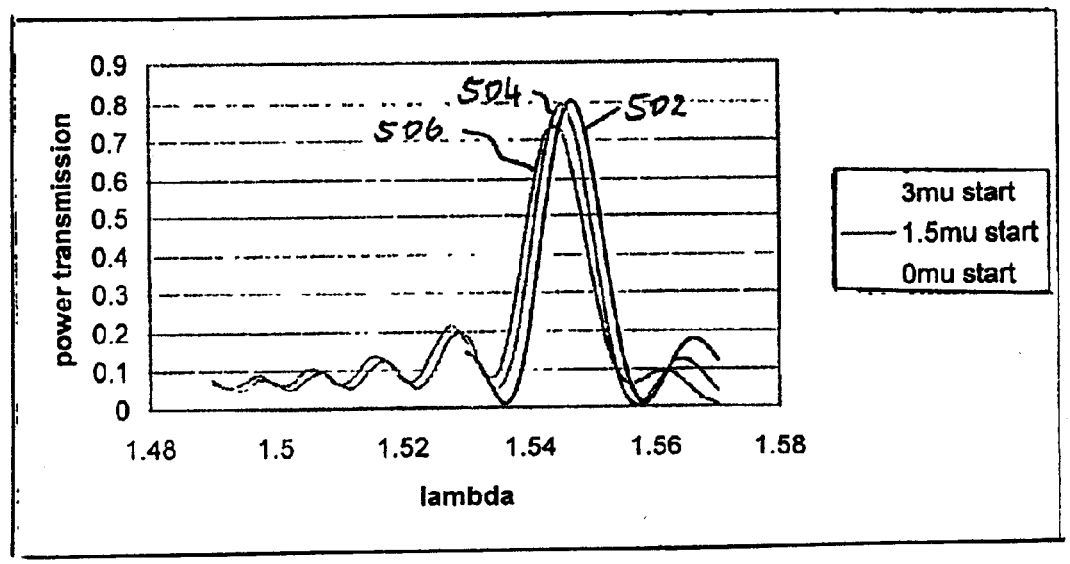
FIG. 5 presents a graph showing power transmission through the grating assisted coupler of FIG. 2 for different starting positions for the grating.

The performance of the structure illustrated in FIG. 2 was tested for misalignment between the start of the second waveguide and the grating by calculating the transmission through the coupler for cases where the grating started at different points relative to the start of the second waveguide. The results, illustrated in the graph in FIG. 5, show a first curve 502, where the misalignment was zero, and so this curve 502 provides the optimum performance. The second curve, curve 504, shows the transmission through the coupler when the misalignment was 1.5 µm and the third curve 506 shows the performance when the when the misalignment was 3 µm. The misalignment was made by changing the value of $l_p$. Small misalignments, of the order of 1–1.5 µm result in a slight wavelength shift of the transmission peak, without a significant loss of transmission. Larger values of misalignment, for example 3 µm or higher, result not only in a wavelength shift but also a more significant decrease in the optical power transmitted through the coupler. Since the period, P, of the grating 208 was 12.1 μm, a misalignment of 3 μm represents a misalignment of about 0.25P, which is less than 0.3P. A misalignment of 1.5 μm represents a misalignment of less than 0.125P.

EXAMPLE 1

Figure 6:
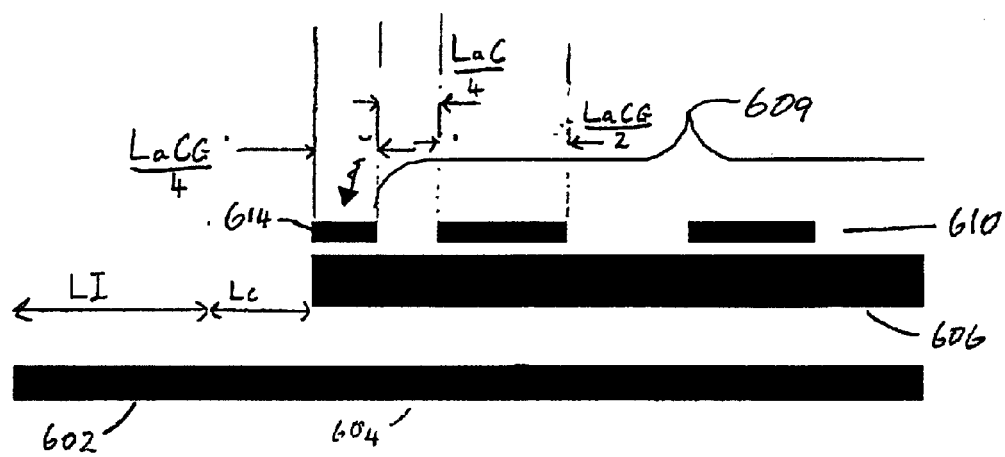
FIG. 6 schematically illustrates another embodiment of a grating assisted coupler according to the present invention.

One embodiment of a coupler structure having a lead-in structure is illustrated in FIG. 6. A nomenclature for such as structure is:

(LI)(LC)(La/4 CG)[(La/4 C)(La/2 CG)(La/4 C)]N where LI is the length of the input waveguide section 602; LC is the length of the first waveguide 604 that has no second waveguide 606 above it; La/4 CG is a quarter period of the coupler with the grating layer (this is the length of the lead-in section 614); La/4 C is a quarter period of the periodic structure 609 that has no grating layer 610, and La/2 CG is a half period of coupler that includes the grating layer 610. N signifies that the pattern in square brackets is repeated N times over the length of the coupler. For a period of 12.1 μm, 21 grating periods (N=21) are used to set the grating length at about 256 μm.

Figure 7:
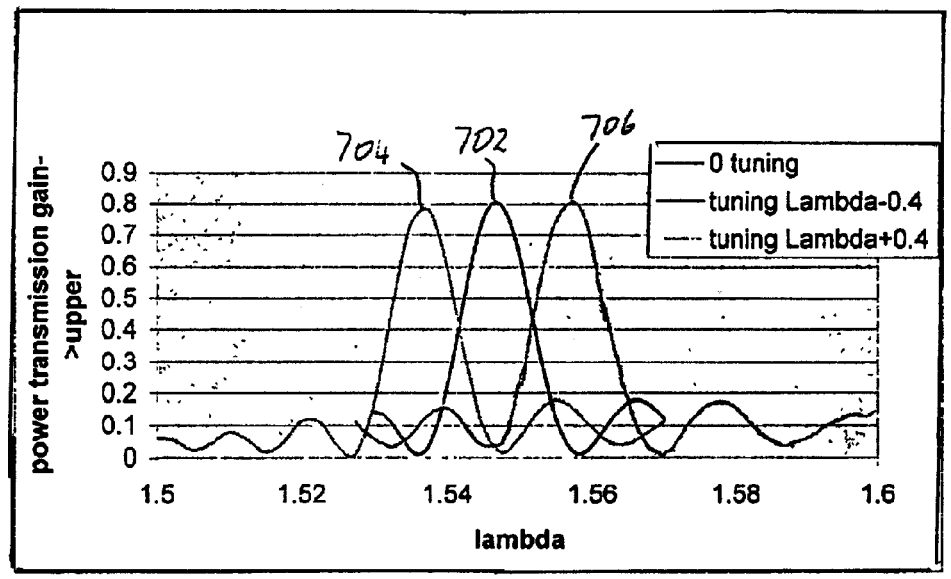
FIG. 7 presents a graph showing power transmission through a grating assisted coupler for assisting gratings of different periodicity.

Another important feature of a grating-assisted coupler is its ability to operate at different wavelengths through tuning. The tuning ability of the structure illustrated in FIG. 6 was modelled by changing the period of the grating by±0.4 μm. The results are illustrated in FIG. 7. The first curve 702 shows the calculated transmission through the coupler as a function of wavelength for the original grating period of 12.1 μm. The second curve 704 shows the coupler transmission for a grating period of 11.7 μm, and the third curve shows the coupler transmission for a grating period of 12.5 μm. The transmission curves are similar in shape, and so no deformation of the transmission curve is seen upon tuning the grating. It is also seen from the figure that a change in grating period of 1 μm results in a shift in the peak transmission wavelength of about 26 nm. This numerical test of the tunability of the coupler is equivalent to changing the refractive index in the second waveguide by injecting current.

EXAMPLE 2

Figure 8:
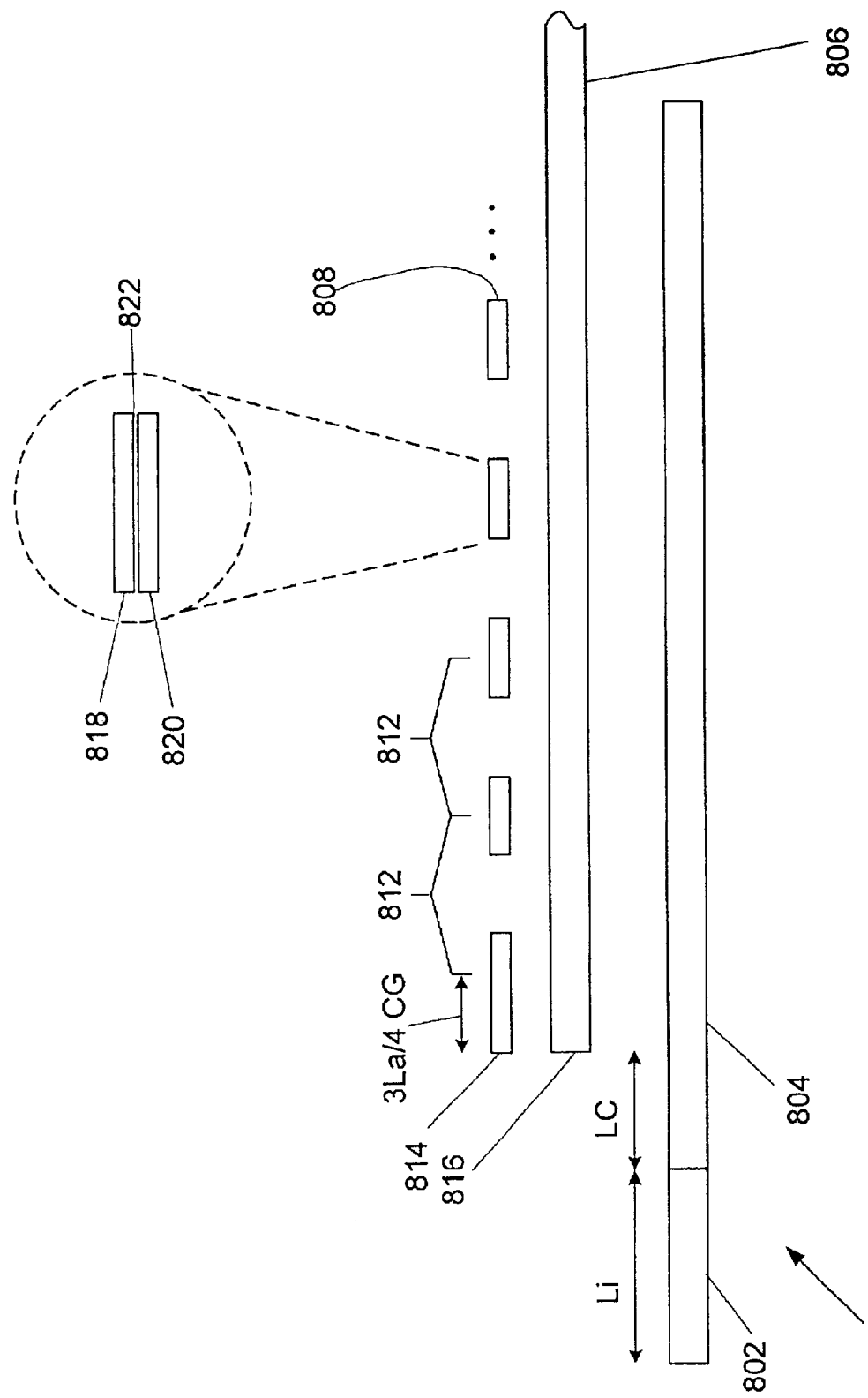
FIG. 8 schematically illustrates a specific embodiment of a grating assisted coupler.

Another example of a grating-assisted coupler structure according to the present invention is illustrated in FIG. 8. The coupler 800 includes an input waveguide 802, which may be an active waveguide, coupled to the first waveguide 804. The second waveguide 806 lies above the first waveguide and the grating layer 808 lies close to the other side of the second waveguide 806 for the first waveguide 804.

The coupler structure 800 may be described using a nomenclature similar to that used above for the structure illustrated in FIG. 5, as:

(LI)(LC)(3La/4 CG)[(DC/2*La CG)((1-DC)*La C)(DC/2*La CG)]N where LI is the length of the input waveguide section 802; LC is the length of the first waveguide 804 that has no second waveguide 806 above it; 3La/4 CG is a three quarter period of the coupler with the grating layer (this includes the length of the lead-in section 814). The expression in square brackets describes the basic grating unit 812 that is repeated to form the periodic structure of the grating layer 808; DC is the duty cycle of the periodic structure and corresponds to that fraction of the basic grating unit 812 that includes the grating layer 808; La CG represents the length of the basic grating unit 812 that has the grating layer 808 and La C represents that length of the basic grating unit 812 that has no grating layer 808. N signifies that the pattern in square brackets is repeated N times over the length of the grating.

In this particular example, LC=21 μm, 3La/4 CG=9.1 μm, the grating period is 12.1 μm and the grating has a length of 256 μm. The grating layer 808 was assumed to be formed from two layers 818 and 820 of grating material, each 40 nm thick, separated by a spacer 822 of 10 nm, as illustrated in the inset in FIG. 8. The double grating layer 808 is advantageous where the coupler 800 is coupled to a reflector grating layer, for example a reflector section 108 as illustrated in FIG. 1. A reflector grating needs only a single grating layer, and so one of the grating layers 818 or 820 may be continued into the reflector grating, whereas the other grating layer 820 or 818 is confined to the coupler.

In an actual device, a tuning electrode may be placed over the first waveguide 804 away from the intersection between the input waveguide 802 and the first waveguide, or even over only the second waveguide 806, so as to avoid tuning any poorly formed portions of the waveguides close to the intersection of the input and first waveguides 802 and 804.

The vertical layer structure assumed for the coupler is as shown in Table I.

TABLE I

Couplor vertical layer structure

| Layer | Thickness (μm) | Material |
| --- | --- | --- |
| Cap layer | 0.1 | InP |
| Upper grating layer | 0.040 | Q1.45 |
| Upper grating spacer | 0.01 | InP |
| Lower grating layer | 0.040 | Q1.45 |
| Lower grating spacer | 0.03 | InP |
| Upper waveguide | 0.45 | Q1.45 |
| Spacer | 0.6 | InP |
| Lower waveguide | 0.208 | Q1.3 |

The terms Q1.45 and Q1.3 refer to a quaternary InGaAsP material, lattice matched to InP, and having a photoluminescence at 1.45 μm and 1.3 μm respectively.

Figure 9:
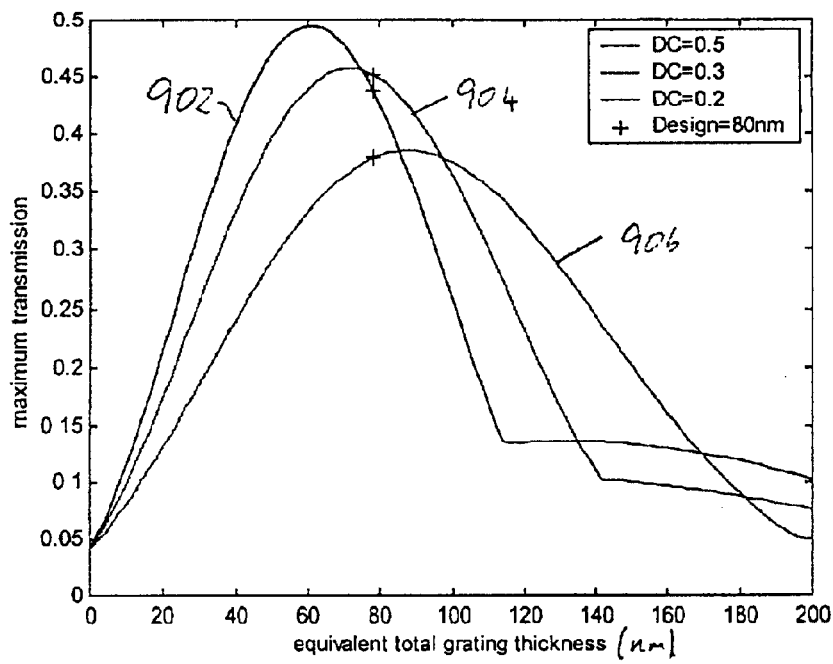
FIG. 9 presents a graph showing power transmission through a grating assisted coupler as a function of equivalent grating thickness, for various grating duty cycles.

The graph illustrated in FIG. 9 shows the effect of the changing the duty cycle. The graph illustrates the transmission through the coupler plotted against equivalent grating thickness, for different values of duty cycle. The equivalent grating layer thickness is approximately the same as the sum of the thicknesses of the grating layers 818 and 820, and is proportional to the coupling coefficient. For curve 902, the duty cycle is 50%, for curve 904, the duty cycle is 30% and for curve 906, the duty cycle is 20%. The optimum transmission of 0.49, which occurs for an equivalent grating thickness of around 60 nm, with a duty cycle of 50%.

A measure of whether the grating thickness should be increased or reduced may be obtained by comparing the output powers. If, for example equal power is obtained for couplers having 30% and 50% duty cycles, then it may be deduced that that the grating total equivalent grating thickness is 74 nm instead of 80 nm. The 40-10-40 grating structure listed in Table I is not optimized for maximum transmission, but was designed for experimental purposes.

Figure 10:
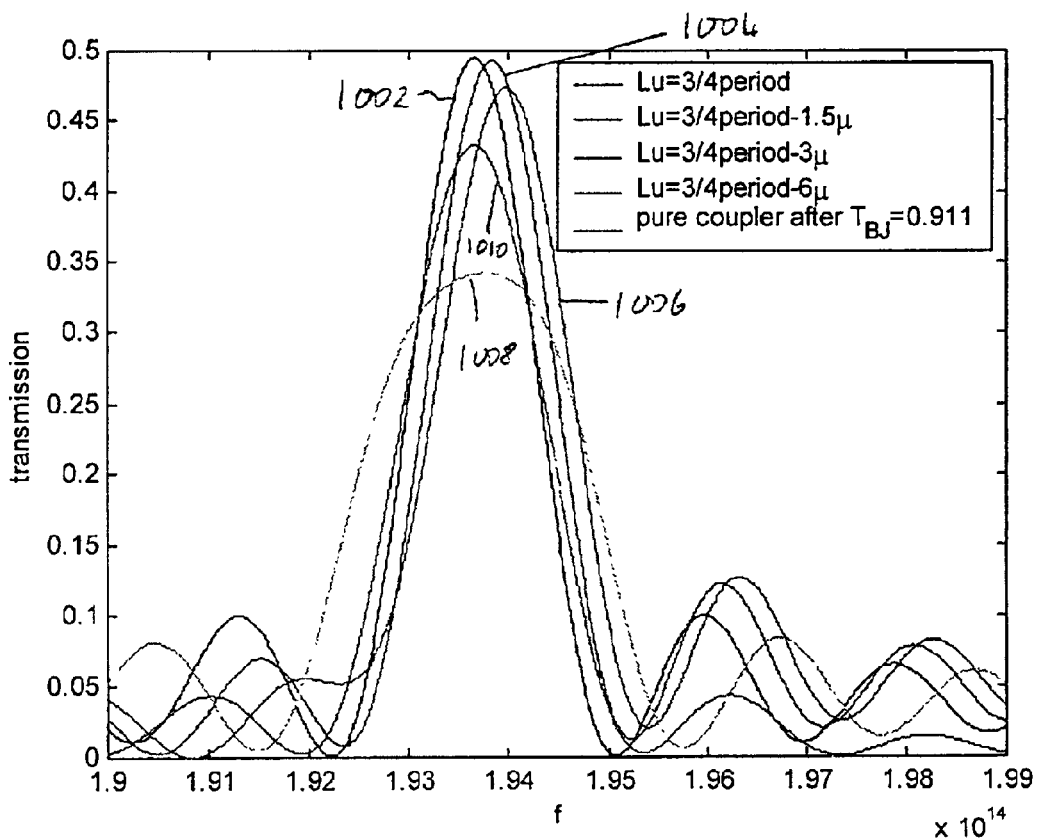
FIG. 10 presents a graph showing power transmission through a grating assisted coupler as a function of light frequency and different start positions for the grating.

The transmission through the coupler 800 was calculated for various misalignment conditions, the results of which are illustrated in the graph in FIG. 10, showing transmission as a function of optical frequency in Hz. The transmission of the coupler is shown as curve 1002, assuming a structure similar to that illustrated in FIG. 8 except for an effective grating thickness of about 60 nm, to produce a maximum coupler transmission of 49%. Curves 1004, 1006 and 1008 show the calculated transmission where there is misalignment between the grating and the second waveguide 806. In curves 1004, 1006 and 1008, the misalignment was assumed to be 1.5 $\mu$m, 3 $\mu$m and 6 $\mu$m respectively, representing misalignments of approximately 0.125P, 0.25P and 0.5P respectively. Curve 1010 illustrates the transmission of light through the coupler ignoring the initial excitation of the second waveguide 806 at its start 816.

With ideal alignment of the second waveguide 806 and grating 808, the maximum transmission through the coupler 800, curve 1002, is calculated to be about 0.49. The sidelobes do not reach a zero level asymptotically.

For small misalignments, approximately 1.5 $\mu$m or less, the center frequency shifts and the sidelobes become asymmetric. The maximum transmission, however, stays close to the value for perfect alignment. At higher values of misalignment, the maximum transmission is decreased, with a maximum transmission of about 0.34 being achievable where the misalignment is as high as 6 $\mu$m.

It will be appreciated that various modifications may be made to the different embodiments described above while remaining within the scope of the invention. For example, the semiconductor materials used for the different layers of the coupler may be different from those listed in Table 1. To illustrate, the high refractive index material may be some other alloy, rather than Q1.45, and may be Q1.39. Furthermore, the grating thickness, length and grating spacer thickness may be adjusted. For example, there may be only one grating layer, rather than two grating layers, and the grating be 50 nm thick with a 50 nm grating spacing and a 370 $\mu$m grating length. The width of the coupler waveguides may be around 1.5 $\mu$m.

To summarize, controlling the phase of the injected light to be similar to the phase of the grating-coupled light results in increased frequency selectivity and increased transmission through the coupler. For a grating structure, for example as illustrated in FIG. 2, it is advantageous to have Ip=mP. For other structures, for example as illustrated in FIGS. 6 and 8, it is advantageous for the distance between the center of the first island forming the periodic structure to be positioned (¾+m)P from the start of the second waveguide. Where the duty cycle is 50%, there may be no grating layer for the first half period, and then the grating islands continue periodically. Where there is a lead-in structure, there are several possibilities for structuring the grating layer. For example, the lead-in structure may be formed from a whole period of the grating layer, followed by a half period of no grating layer. In another example, as shown in FIG. 6, the lead-in structure includes a quarter period of grating layer, followed by another half period without grating layer, followed by a half period with grating layer. In another example, illustrated in FIG. 8, the lead-in structure includes a ¾ period of grating layer, followed by a periodic basic structure having a ¼ period of grating layer, a ½ period without grating layer and a ¼ period with grating layer.

When fabricating a grating assisted coupler with a laser, for example the laser structure illustrated in FIG. 1, a typical approach is to first grow the gain section over the wafer and then etch the gain section away from those regions where the coupler and/or reflector are to be situated. The coupler waveguides and reflector structure are then regrown on the etched areas. A problem arises due to irregular growth between the gain and the coupler sections. Because of these irregularities, it is difficult to predict the relative phase of the excitations of the two waveguides, and therefore it is difficult to determine where the start point of the grating should be located. The opposite order of growth may also be employed, where the coupler waveguides are grown first and then etched away at those areas where the gain section is to be located. The gain section is then regrown in the etched areas. In both approaches, the position of the start of the grating is preferably selected so that the light coupled via the grating is in phase with the light launched into the end of the second waveguide. This needs the positions of the start of the second waveguide and the grating to be controllable.

One approach to overcoming this problem is to remove the end of the second waveguide close to the joint between the input waveguide and the first waveguide. The position of the etching may be well controlled and, therefore, the distance between the start of the second waveguide and the grating may also be well controlled.

One embodiment of a fabrication method that Includes etching the start of the second waveguide is now described with reference to FIGS. 11A–11G, which schematically illustrate a cross section through the device at various stages of the fabrication process.

Figure 11A:
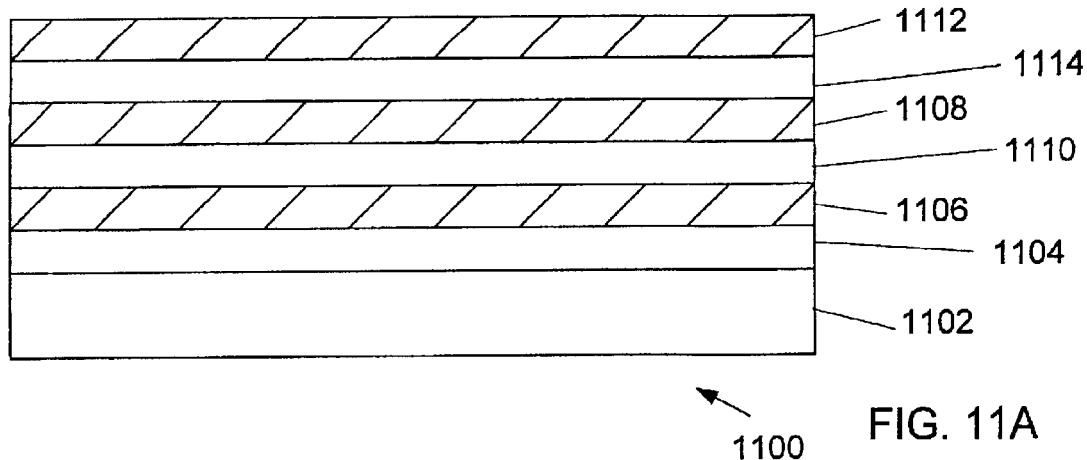
FIGS. 11A–11G schematically illustrate an integrated optical device at various stages of fabricating a grating assisted coupler according to one embodiment of the present invention.

Referring now to FIG. 11A, the device includes a substrate 1102, over which an epilayer 1104 is grown to promote reduced-defect growth of the subsequent superstrate layers. A first waveguide layer 1106 is grown above the epilayer 1104. A second waveguide layer 1108 is grown over the first waveguide layer 1106, separated from the first waveguide layer 1106 by a coupler spacer layer 1110. A grating layer 1112 is grown over the second waveguide layer 1108, and Is separated from the second waveguide layer 1108 by a grating spacer layer 1114.

The waveguide layers 1106 and 1108 have a higher refractive index than the neighboring layers 1104, 1110 and 1114, to provide vertical optical confinement in the device 1100. Horizontal confinement in the waveguide layers 1106 and 1108 is also provided, although not illustrated. The waveguide layers 1106 and 1108 may, for example, be buried in material of relatively low refractive index to provide horizontal confinement.

Where the resulting device is to be used for light in the wavelength range 1500–1620 nm, commonly used for optical communications, the substrate 1102 and epilayer 1104 may be formed from InP, while the waveguide layers 1106 and 1108 may be formed of GaInAsP. The spacer layers 1110 and 1114 may also be formed of InP.

Figure 11B:
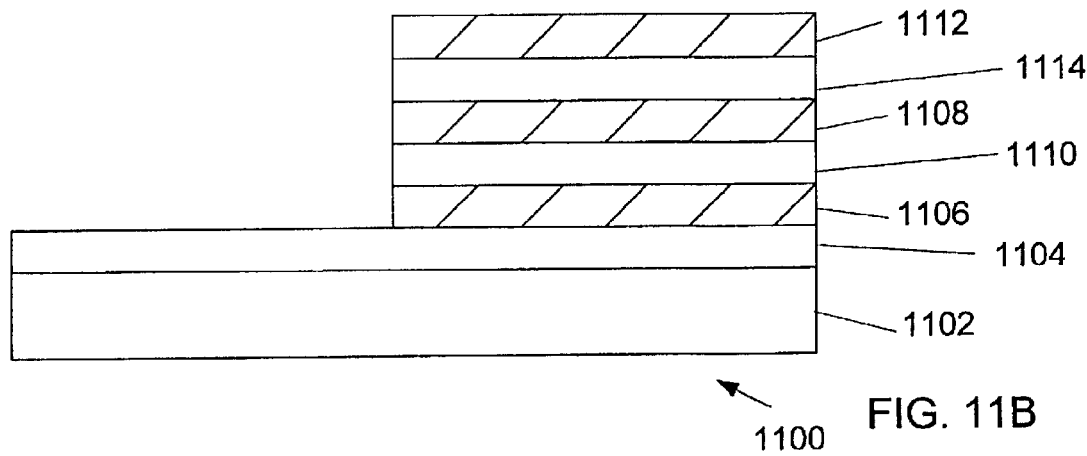
Figure 11C:
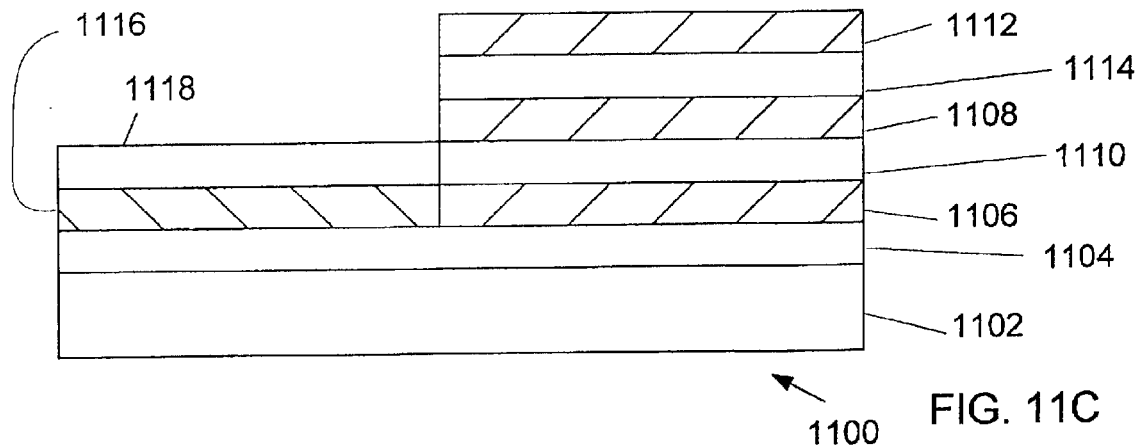

A portion of the layers 1106, 1108, 1110, 1112 and 1114 is etched back to the epilayer 1104, as is illustrated in FIG. 11B. An input waveguide layer 1116 is grown where the layers were previously etched, as illustrated in FIG. 11C. The input waveguide layer 1116 provides vertical confinement and couples to the first waveguide layer 1106. A cover layer 1118 may be provided over the input waveguide layer 1116. The input waveguide layer 1116 may be an active layer where the device 1100 is a laser device. Where the input waveguide layer 1116 is an active layer, the active layer may include a quantum well structure.

Figure 11D:
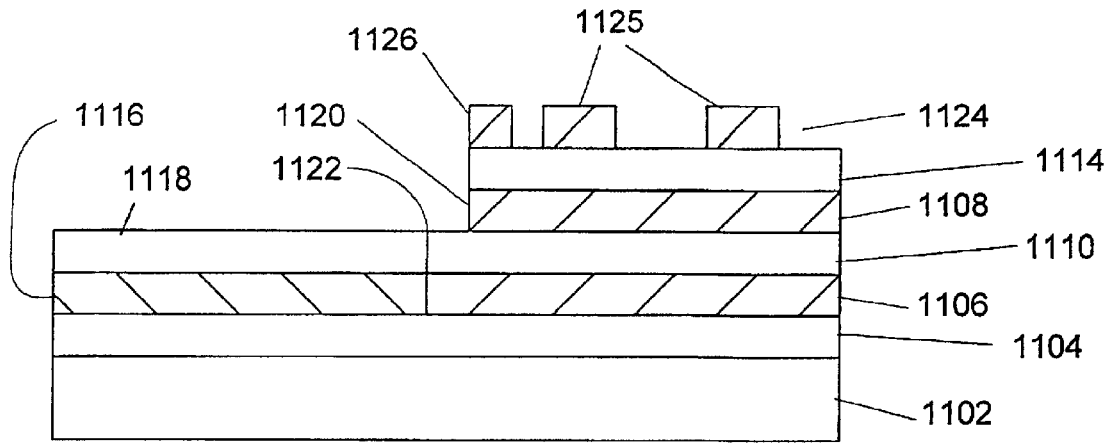

Referring now to FIG. 11D, the ends of the second waveguide layer 1108, the grating spacer layer 1114 and the grating layer 1112 are etched back so that the second waveguide layer 1108 has a starting position 1120 that is not at the same position as the start 1122 of the first waveguide layer 1106. Furthermore, the desired grating structure 1124 is etched into the grating layer 1112. The grating structure 1124 includes the periodic structure 1125 of the grating and may also include any lead-in structure 1126.

The input waveguide layer 1116 and cover layer 1118 may optionally be grown after the starting position 1120 of the second grating layer 1108 has been etched back from the starting position 1122 of the first grating layer.

Figure 11E:
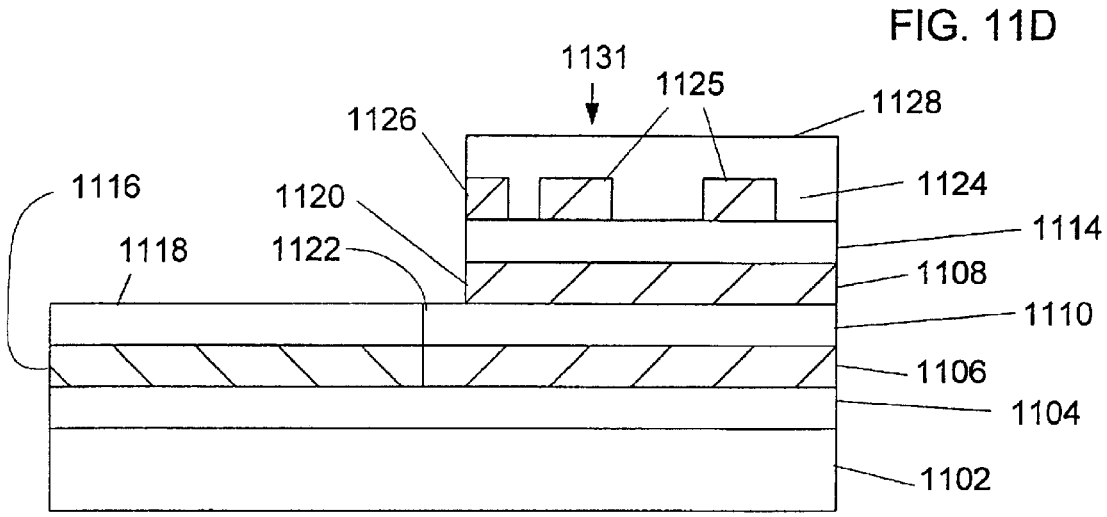
Figure 11F:
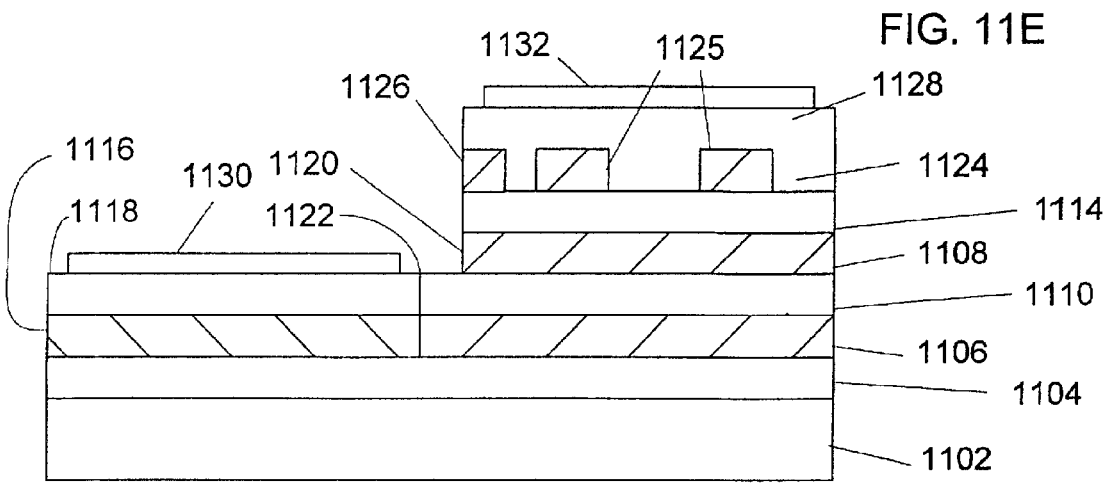

A cap layer 1128 is then grown over the grating structure 1124, as illustrated in FIG. 11E, to complete the grating-assisted coupler 1131 formed by the first and second waveguide layers 1106 and 1108, and the grating structure 1124. An electrode 1130 may be provided over the input waveguide layer 1116 to permit injection of a drive current where the input waveguide layer 1116 includes an active layer, as illustrated in FIG. 1F. An electrode 1132 may also be provided over the coupler 1131 so that a tuning current may be injected into the coupler 1131.

It will be appreciated that the second waveguide layer 1108 of the coupler 1131 may be coupled to another waveguide (not illustrated), for example the waveguide of a phase region or a reflector region of a GCSR laser, or some other waveguide. Furthermore, the first and second waveguides 1106 and 1108, the grating layer 1112 and the spacer layers 1110 and 1114 are illustrated with similar thicknesses, although this need not be the case. These layers may have different thicknesses.

Figure 11G:
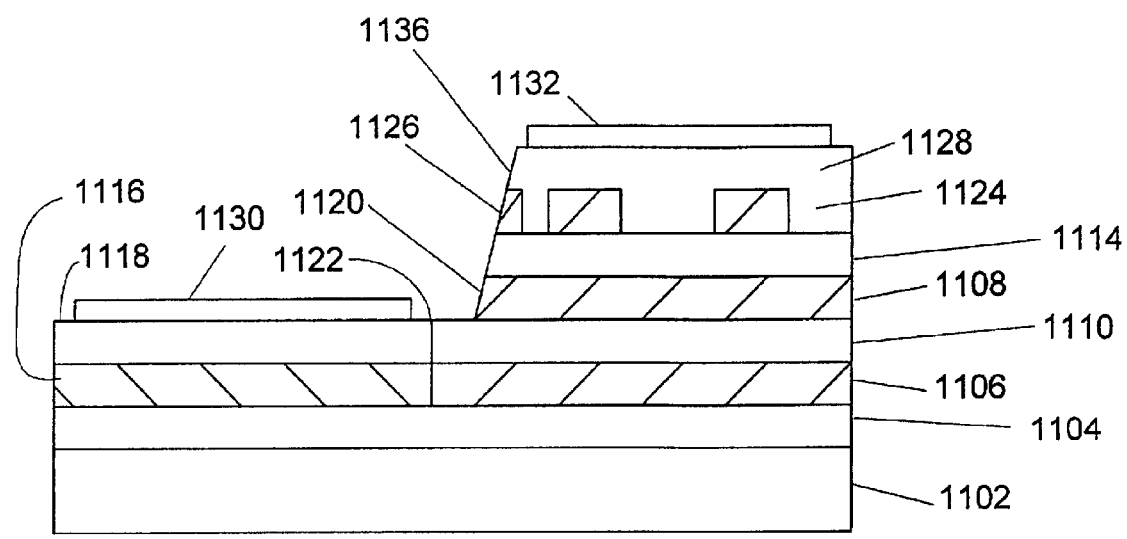

It will also be appreciated that the ends of the second waveguide layer 1108, the grating spacer layer 1114 and the grating structure 1124 may not be etched vertically in the steps taken between the views illustrated in FIGS. 11A and 11B. Instead, the etching may leave an angled face 1136, as illustrated in FIG. 11G. Furthermore, an optical device fabricated according to the method described with respect to FIGS. 11A–11G may include other layers not illustrated.

Another embodiment of a method for fabricating a grating-assisted coupler is now discussed with reference to FIGS. 12A–12F, which schematically illustrate a cross-section through the device at various stages of the fabrication process.

Figure 12A:
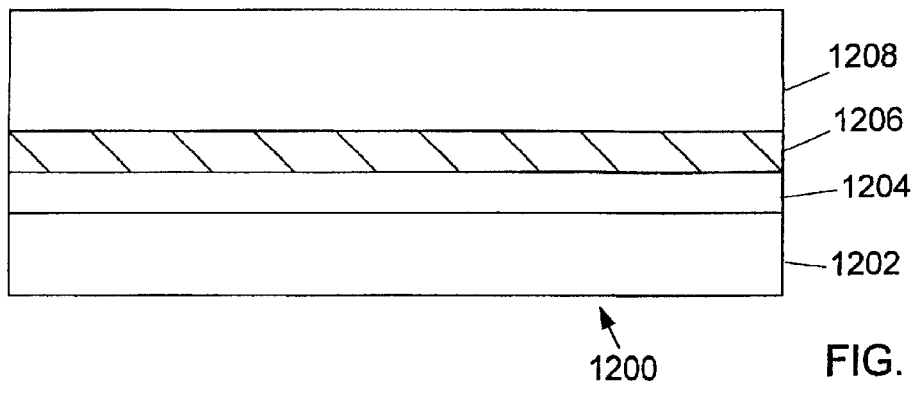
FIGS. 12A–12F schematically illustrate an integrated optical device at various stages of fabricating a grating assisted coupler according to another embodiment of the present invention.

Referring now to FIG. 12A, the device includes a substrate 1202, over which an epilayer 1204 is grown to promote reduced-defect growth of the subsequent layers. An input waveguide layer 1206 is formed over the epilayer 1204. A cover layer 1208 may be provided over input waveguide layer 1206. The input waveguide layer 1206 may be an active layer where the device 1200 is a laser device. Where the input waveguide layer 1206 is an active layer, the active layer may include a quantum well structure.

Figure 12B:
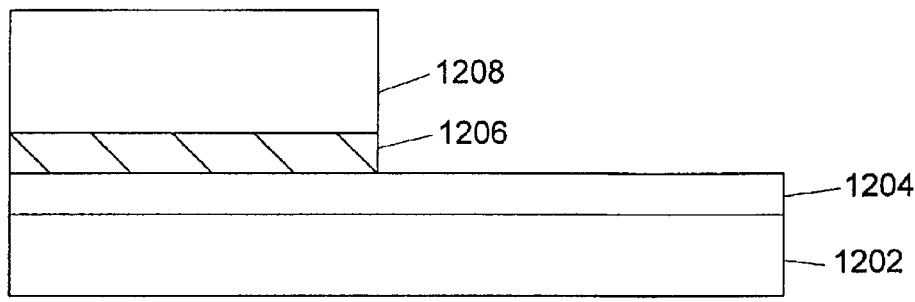
Figure 12C:
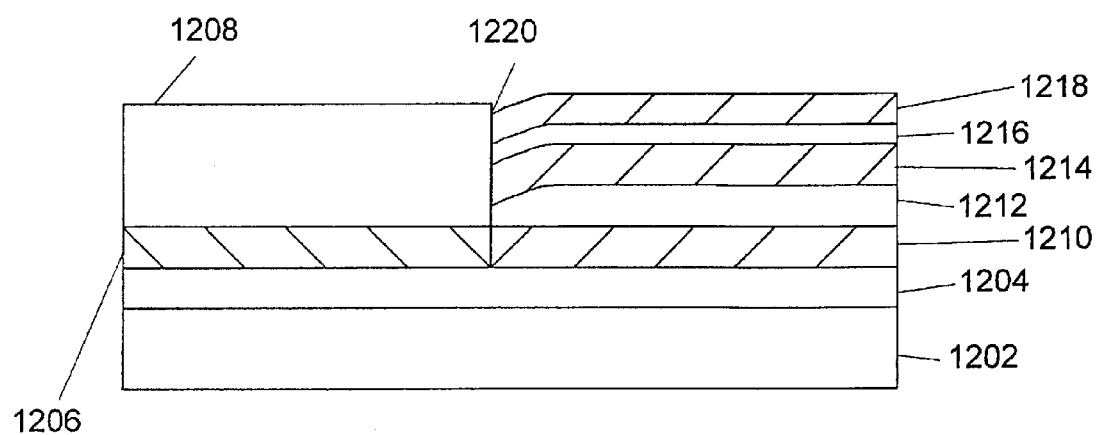

The input waveguide layer 1206 and cover layer 1208 may be etched back, as illustrated in FIG. 12B, and a number of other layers regrown in the etched region, as illustrated in FIG. 12C. The layers include a first waveguide layer 1210, a coupler spacing layer 1212, a second waveguide layer 1214, a grating spacer layer 1216 and a grating layer 1218. The ends 1220 of the second waveguide layer 1214 and the grating layer 1218 closest to the cover layer 1208 may be malformed, due to the proximity of the cover layer 1208.

As well as providing vertical confinement, the input waveguide 1206, the first waveguide 1210 and the second waveguide 1214 may also provide horizontal confinement (not illustrated). For example, the waveguides 1206 1210 and 1214 may be formed of a relatively high refractive index material that is buried in a material of relatively low refractive index.

Figure 12D:
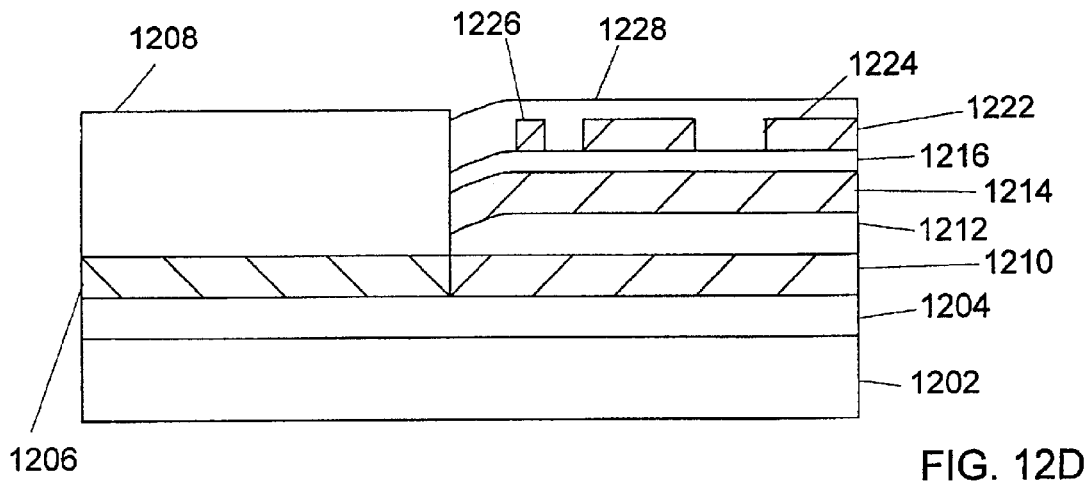

The grating layer 1218 may then be etched to form a grating structure 1222 that includes a periodic structure 1224 and a lead in-structure 1226, as illustrated in FIG. 12D. A coupler cap layer 1228 may then be grown over the grating structure 1222.

Figure 12E:
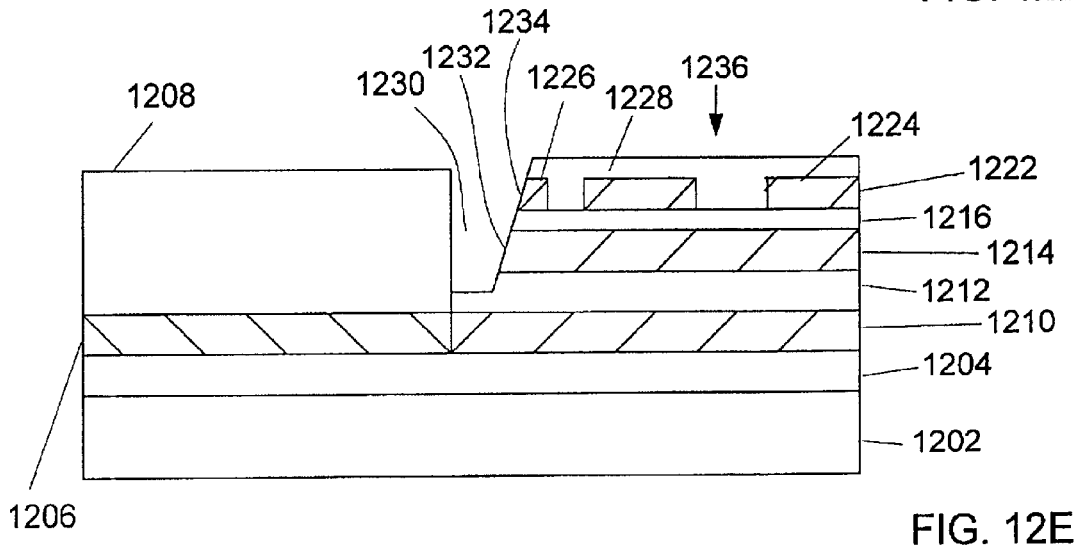
Figure 12F:
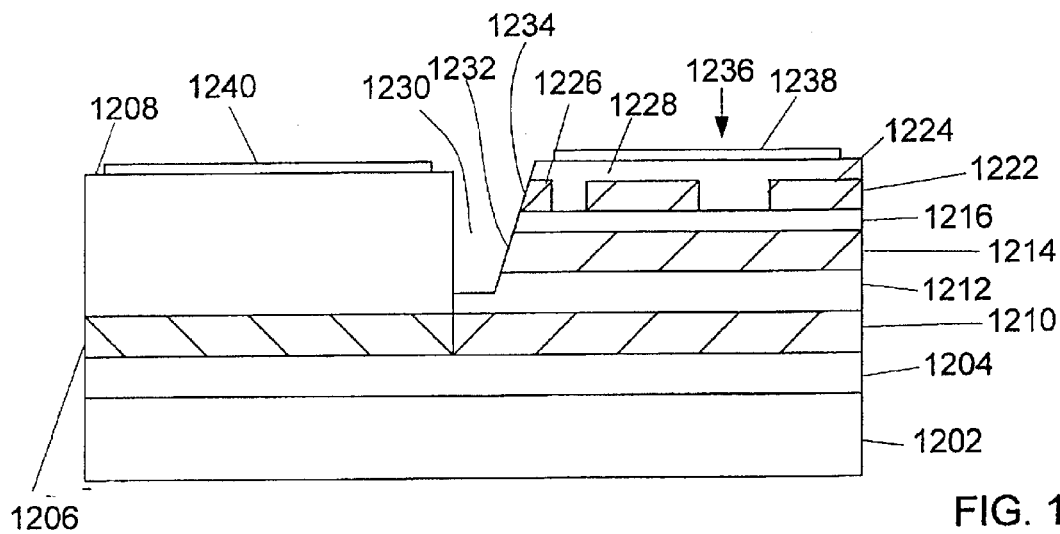

A well 1230 may then be etched into the device 1200 to clearly define the starting end 1232 of the second waveguide 1214 and the starting end 1234 of the grating structure 1222, as illustrated in FIG. 12E, to complete the coupler 1236.

An electrode 1238 may be provided on the coupler region 1236 to inject current into the coupler 1236 and over the input waveguide 1206, for example to provide gain where the input waveguide 1206 is an active waveguide.

It will be appreciated that the second waveguide layers 1108 and 1214 may be coupled to another waveguide (not illustrated), for example the waveguide of a phase region or a reflector region of a GCSR laser, or some other waveguide. Furthermore, thicknesses of the waveguide layers 1210 and 1214, the grating layer 1222 and the spacer layers 1216 and 1212 may be different from those shown in the illustration. In addition, a device fabricated according to the method illustrated with respect to FIGS. 12A–12F may include other layers that are not illustrated.

Figure 13:
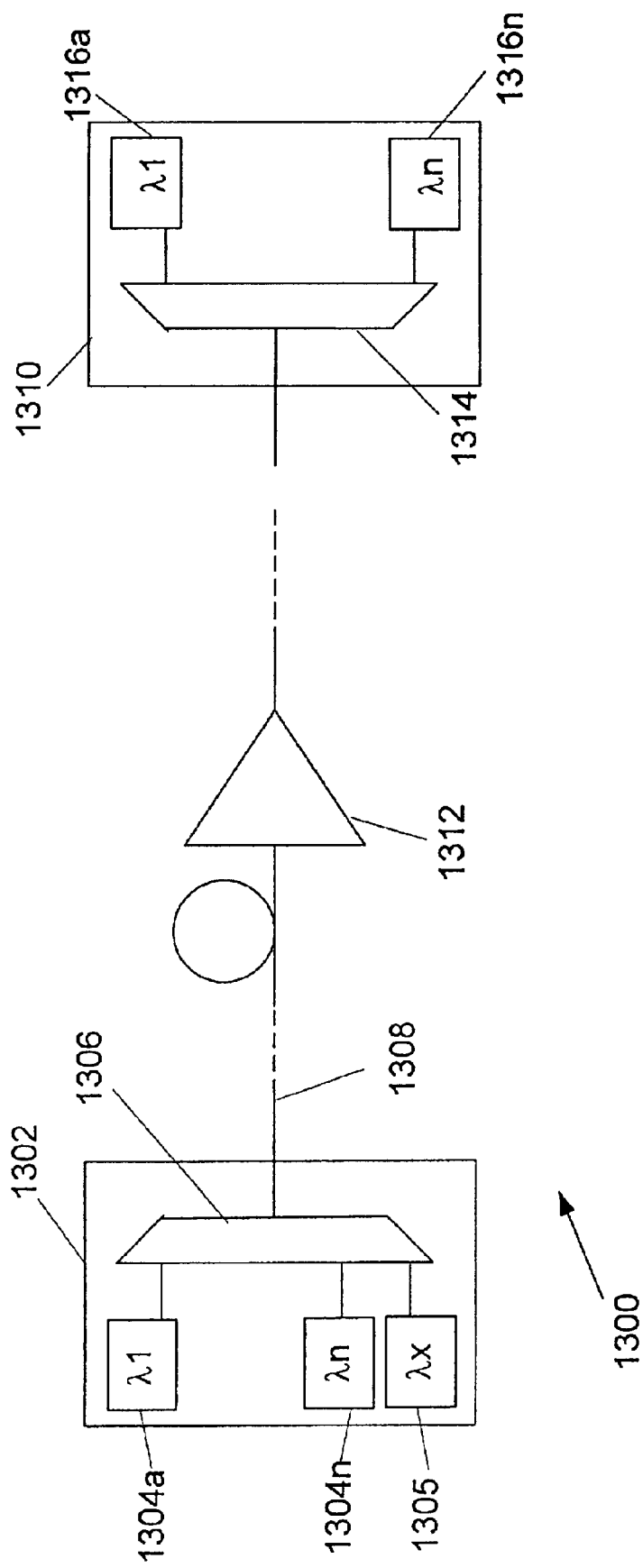
FIG. 13 schematically illustrates an optical communications system that employs a laser according to an embodiment of the present invention.

A laser that incorporates a coupler according to the present invention may be employed in a dense wavelength division multiplexed (DWDM) communications system 1300, schematically illustrated in FIG. 13 The system 1300 includes a DWDM transmitter unit 1302 that includes a number of lasers 1304a–1304n operating at different wavelengths, $\lambda 1$–$\lambda n$. Any of the lasers 1304a–1304n may be a laser whose wavelength is stabilized according the present invention. In addition, one or more spare lasers 1305 may operate as a substitute if any of the lasers 1304a–1304n fail. The lasers 1304a–1304n and 1305 may each include modulators for modulating Information onto the respective output light beams. The outputs from the lasers 1304a–104n, 1305 may be combined in a DWDM combiner arrangement 1306 and launched as a DWDM signal into an optical fiber communications link 1308 that is coupled to a DWDM receiver 1310. The fiber link 1308 may include one or more fiber amplifier stages 1312 to amplify the DWDM signal as it propagates to the DWDM receiver 1310. Other elements, such as isolators, switches, add/drop multiplexers and the like may also be disposed along the fiber link 1308. The DWDM receiver 1310 demultiplexes the received DWDM signal in a demultiplexer 1314 and directs signals at different wavelengths $\lambda 1$–$\lambda n$ to respective channel detectors 1316a–1316n.

Figure 14:
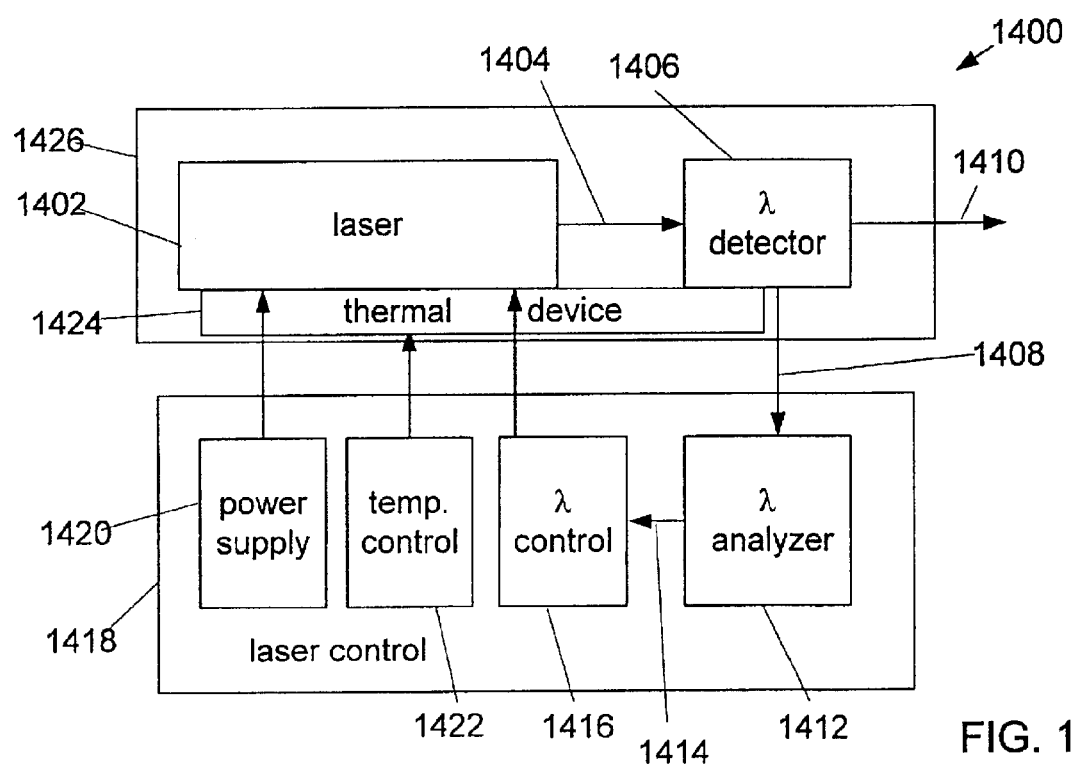
FIG. 14 schematically illustrates a laser unit that employs a laser according to an embodiment of the present invention.

A block schematic diagram showing various elements of a laser unit 1400, that uses a laser according to the present invention, is illustrated in FIG. 14. Such a laser unit 1400 may be incorporated in a DWDM transmitter unit. The laser 1402 generates an output light beam 1404 that is directed to a wavelength detector unit 1406, which generates an output signal 1408 determined by the wavelength of the light in the light beam 1404.

A residual output beam 1410, passing from the wavelength detector unit 1406, may carry optical output power not used in the determination of the wavelength. The residual output beam 1410 may be used as the useful optical output from the laser 1402. Where the output light beam 1404 carries the main optical output from the laser 1402, the wavelength detector unit 1406 advantageously uses only a small fraction, for example a few percent, of the output light beam 1404, in order to increase the power in the residual output beam 1410.

A wavelength analyzer unit 1412 may receive and analyze the output signal 1408 from the wavelength detector unit 1406 to determine the wavelength of the light beam 1404. The analyzer 1412 typically generates an error signal 1414. The size of the error signal 1414 typically indicates the amount by which the measured wavelength of the laser deviates from a desired value. The error signal 1414 is directed to a wavelength tuning controller 1416 that is connected to the laser 1402 and controls the operating wavelength of the laser 1402.

The wavelength tuning controller 1416 may be incorporated with a laser controller 1418 that includes the power supply 1420 for providing power to the laser 1402 and a temperature controller 1422 that controls the temperature of the laser 1402. The laser 1402 may be coupled, for example, to a thermoelectric device 1424 or other type of device for adjusting temperature of the laser 1402.

The laser 1402 and wavelength detector unit 1406 may be enclosed within a housing 1426 to prevent environmental effects from affecting the operation of the laser 1402 and the wavelength detector unit 1406. The device 1424 for adjusting operating temperature may also be located within the housing 1426.

In the laser 100 illustrated in FIG. 1A, light propagates through the coupler region 104 in both directions, from the left and from the right. Up until now, the discussion has been concerned with the light that is coupled from first waveguide 116 to the second waveguide 118. Where the first waveguide 116 ends abruptly at its terminal end 117, there may be advantages for setting the phase of the grating 120 so that the light coupled from the second waveguide into the first waveguide 116 is in phase with the light injected into the terminal end 117 of the first waveguide 116. In some embodiments of laser, however, the terminal end 117 of the first waveguide is not abrupt but, rather, the width of the first waveguide 116 increases at the terminal end. This reduces the possibility that power is reflected from the terminal end of the first waveguide 116 towards the active waveguide 112, or is coupled to the waveguides 123 or 125 in the phase region 106 or the reflector region 108.

Furthermore, the mode in the waveguide 123 is similar to the mode in the waveguide 118. Thus, the matching between the waveguides 123 and 118 is good, and the transmission between the modes of waveguides 118 and 123 is high. In such a case, the fraction of the leftward propagating light injected into the terminal end 117 of the first waveguide 116 is smaller than the fraction of rightward propagating light injected into the starting end 119 of the second waveguide 118. Accordingly, the advantages of setting the correct phase between coupled and injected light may be greater for the starting end 119 of the second waveguide than for the terminal end 117 of the first waveguide 116.

Figure 15:
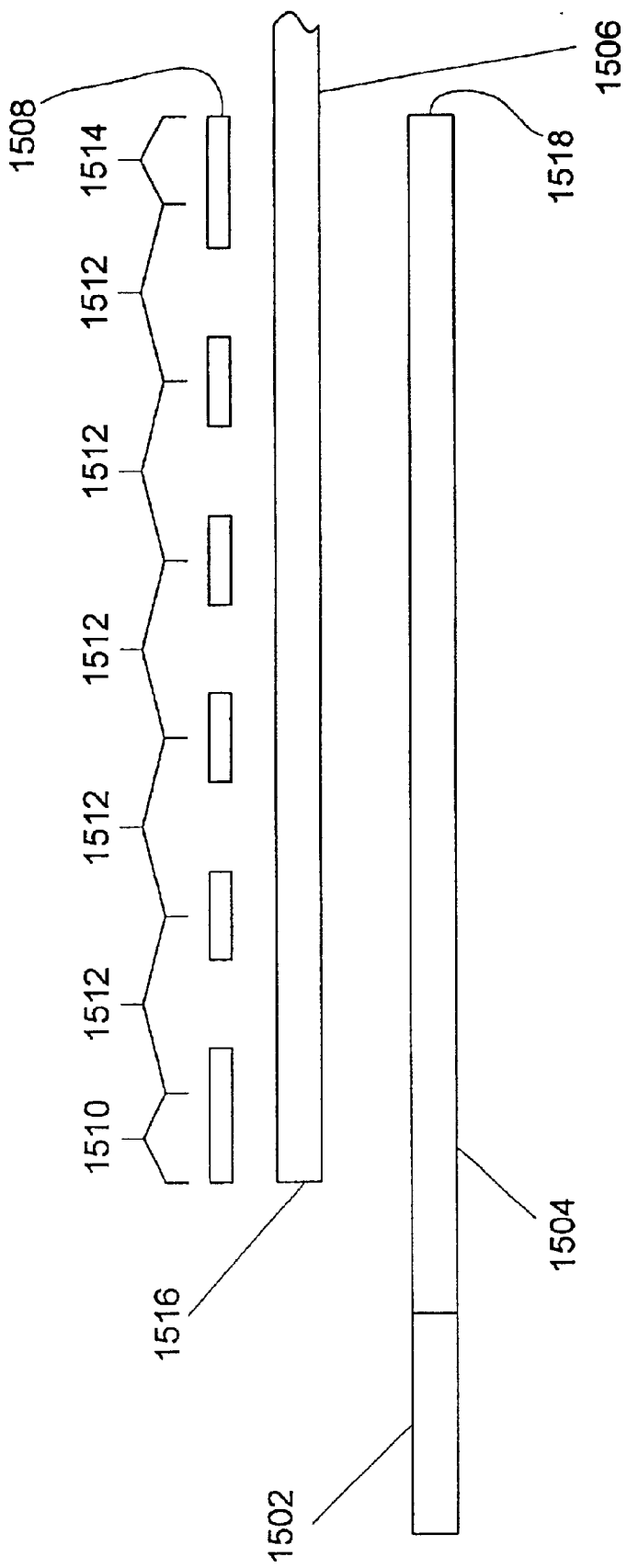
FIG. 15 schematically illustrates an embodiment of a grating assisted coupler providing phase correction at both ends, according to the present invention.

In other embodiments of a grating-assisted coupler, however, it may be important to ensure that the light injected into the terminal end of the first waveguide has a desired phase relationship with the light coupled from the second waveguide into the first waveguide. One particular embodiment of such a coupler 1500 is schematically illustrated in FIG. 15. The coupler 1500 includes an input waveguide 1502, that may be, for example, an active waveguide, coupled to a first waveguide 1504. A second waveguide 1506 is disposed near the first waveguide 1504, and a grating structure 1508 is disposed close to the second waveguide 1508. The grating structure 1508 may be above the second waveguide 1506, as illustrated, between the first and second waveguides 1504 and 1506, or below the first waveguide 1504.

The grating structure 1508 includes a first lead-in section 1510 that starts as at the same position along the coupler 1500 as the start end 1516 of the second waveguide. The first lead-in structure 1510 is used to control the phase of light injected into the end 1516 of the second waveguide relative to the phase of the rightwardly propagating light coupled from the first waveguide 1504 into the second waveguide 1506.

The grating structure 1508 also includes a repeated pattern of basic grating units 1512. In this particular embodiment, the grating structure 1508 is terminated at its right end by a second lead-in structure 1514 that ends at the same position as the terminal end 1518 of the first waveguide, although termination at this position is not a necessary condition. The second lead-in structure 1514 may be used to control the phase of light injected into the terminal end 1518 of the first waveguide relative to the phase of the leftwardly propagating light coupled from the second waveguide 1506 into the first waveguide 1504. Thus the coupler 1500 may control the phase of the injected and coupled light for both forwards and backwards propagating light, thus enhancing the overall transmission and bandwidth characteristics for light propagation in both directions.

In the examples considered above, the grating was assumed to be formed by a relatively high index material embedded within relatively low index material, referred to as a positive grating. It will be appreciated that the grating structure of a grating-assisted coupler may also be formed from islands of relatively low refractive index material embedded within a relatively high refractive index material, referred to as a negative grating. Where a negative grating is used, the positioning of the start of a negative grating is preferably different from the start of a positive grating by about half a grating period in order to obtain the same beneficial effect of matching the phase of the injected light to the coupled light. In other words, the phase of the negative grating is preferably shifted by $\pi$ relative to the phase of the positive grating in order to achieve the correct phasing between the injected light and the grating-coupled light. For example, where the distance between the start of the second waveguide and the center of the first grating portion of a positive grating is given by $(\frac{3}{4}+m)P$, then the distance between the start of the second waveguide and the center of the first grating portion of a negative grating is given by $(\frac{1}{4}+m)P$.

As noted above, the present invention is applicable to grating-assisted couplers, and is believed to be particularly useful for grating-assisted couplers used as tuning elements in semiconductor lasers. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A grating-assisted coupler device, comprising:
    a first input/output (i/o) waveguide; and
    a coupler unit having
        a first coupler waveguide coupled at a first end to the first i/o waveguide,
        a second coupler waveguide disposed proximate the first coupler waveguide, light propagating from the first i/o waveguide into the coupler unit launching a first portion of light into the first coupler waveguide and a second portion of light into the second coupler waveguide, and
        a grating structure disposed proximate at least one of the first and second coupler waveguides to couple light from the first coupler waveguide to the second coupler waveguide, the grating structure including a periodic structure having a starting end proximate the starting end of the second coupler waveguide and positioned so that the light coupled by the grating structure into the second coupler waveguide from the first coupler waveguide is substantially in phase with the second portion of light launched into the second coupler waveguide.

2. A device as recited in claim 1, wherein the periodic structure is formed by portions of material having a first refractive index embedded within a material having a second refractive index.

3. A device as recited in claim 2, wherein the periodic structure is formed from portions of a relatively high refractive index material embedded within a material of a relatively low refractive index.

4. A device as recited in claim 2, wherein the periodic structure is formed from portions of a relatively low refractive index material embedded within a material of a relatively high refractive index.

5. A device as recited in claim 1, wherein the periodic structure is formed from a basic structure pattern repeated a number of times along the coupler device.

6. A device as recited in claim 5, wherein the basic structure pattern has a duty cycle of approximately 50%.

7. A device as recited in claim 1, wherein the grating structure further includes a lead-in portion extending between the starting end of the periodic structure and a position corresponding to the starting end of the second coupler waveguide.

8. A device as recited in claim 7, wherein the lead-in portion adjoins a first portion of the periodic structure, and a length between a starting end of the lead-in portion and a center of the first portion of the periodic structure is equal to approximately $(\frac{3}{4}+m)P$, where m is an integer value and P is an the period of the periodic structure.

9. A device as recited in claim 8, wherein the periodic structure has a duty cycle of approximately 50%.

10. A device as recited in claim 7, wherein the periodic structure is formed by portions of material having a first refractive index embedded within a material having a second refractive index, and the lead-in portion is formed from the material having the first refractive index.

11. A device as recited in claim 1, wherein the i/o waveguide includes an active waveguide.

12. A device as recited in claim 1, further comprising a second i/o waveguide coupled to a second end of the second coupler waveguide and wherein the first coupler waveguide has a second end position along the coupler selected so that light propagating from the second i/o waveguide into the second coupler waveguide and coupled into the first coupler waveguide by the grating structure is approximately in phase with light launched into the second end of the first coupler waveguide from the second i/o waveguide.

13. A device as recited in claim 12, wherein the grating structure includes a second lead-in structure proximate the terminal end of the periodic structure, a terminal end of the second lead-in structure having a position along the coupler approximately the same as a position of the second end of the first coupler waveguide.

14. A device as recited in claim 1, the periodic structure has a period P and the starting end of the periodic structure lies within 0.3P of an optimum starting position where the phase of the light coupled into the second waveguide coupler by the grating structure is exactly in phase with the light launched into the starting end of the second waveguide structure.

15. A device as recited in claim 14, wherein the starting position of the periodic structure lies within 0.25P of the optimum starting position.

16. A device as recited in claim 14, wherein the starting position of the periodic structure lies within 0.125P of the optimum starting position.

17. A laser, comprising:
a gain region including a gain waveguide;
a coupler region including
a first coupler waveguide coupled at a first end to the gain waveguide,
a second coupler waveguide proximate the first coupler waveguide, light propagating from the gain waveguide into the coupler region launching a first portion of light into the first coupler waveguide and a second portion of light into the second coupler waveguide, and
a grating structure disposed proximate at least one of the first and second coupler waveguides to couple light from the first coupler waveguide to the second coupler waveguide, the grating structure including a periodic structure having a starting end proximate the starting end of the second coupler waveguide and positioned so that the light coupled by the grating structure into the second coupler waveguide from the first coupler waveguide is substantially in phase with the second portion of light launched into the second coupler waveguide; and
a reflector region having a reflector waveguide coupled to receive light from the second coupler waveguide.

18. A laser as recited in claim 17, wherein the reflector region includes at least one distributed Bragg reflector.

19. A laser as recited in claim 17, wherein the reflector region includes a sampled Bragg reflector.

20. A laser as recited in claim 17, wherein the reflector region includes a reflector defining a reflection spectrum having multiple reflectivity maxima.

21. A laser as recited in claim 17, wherein the gain region provides optical gain for light having a wavelength in the range 1500 nm–1620 nm.

22. A laser as recited in claim 17, further comprising a controller coupled to provide gain current to the gain region of the laser.

23. A laser as recited in claim 22, further comprising a laser frequency measurement unit disposed to determine frequency of light output from the laser, the laser frequency measurement unit being coupled to direct a laser frequency signal to the controller, and wherein the controller is coupled to control the frequency of light output from the laser.

24. A laser as recited in claim 22, further comprising an active cooling device disposed to extract heat from the gain region, the controller being coupled to control the active cooling device.

25. An optical communications system, comprising:
an optical transmitter having at least one laser, the laser including
a gain region including a gain waveguide;
a coupler region including
a first coupler waveguide coupled at a first end to the gain waveguide,
a second coupler waveguide disposed proximate the first coupler waveguide, light propagating from the gain waveguide into the coupler unit launching a first portion of light into the first coupler waveguide and a second portion of light into the second coupler waveguide, and
a grating structure disposed proximate at least one of the first and second coupler waveguides to couple light from the first coupler waveguide to the second coupler waveguide, the grating structure including a periodic structure having a starting end proximate the starting end of the second coupler waveguide and positioned so that the light coupled by the grating structure into the second coupler waveguide from the first coupler waveguide is substantially in phase with the second portion of light launched into the second coupler waveguide; and a reflector region having a reflector waveguide coupled to receive light from the second coupler waveguide;

a fiber optic link coupled to receive light signals output from the optical transmitter; and an optical receiver unit coupled to detect the light signals from the fiber optic link.

26. A system as recited in claim 25, further comprising a series of fiber amplifiers disposed on the optical fiber communications link, the series of fiber amplifiers including at least one fiber amplifier unit.

27. A system as recited in claim 26, wherein the at least one fiber amplifier unit includes at least one pump laser coupled to pump a fiber amplifier.

28. A system as recited in claim 25, wherein the optical communications transmission unit includes at least two laser units operating at different wavelengths and further comprising wavelength division multiplexing elements to combine light output from the at least two laser units to produce a multiple channel optical communications signal coupled to the optical fiber communications link.

29. A system as recited in claim 28, wherein the optical communications receiver unit includes wavelength division demultiplexing elements to separate the multiple channel optical communications signal into signal components of different wavelengths and further includes channel detectors to detect respective signal components.

30. A method of forming a coupler, comprising:

forming a first coupler waveguide in a coupler region;

forming a second coupler waveguide in the coupler region over the first coupler waveguide; and forming a grating structure proximate one of the first and second coupler waveguides, the grating structure including a periodic structure having a starting end positioned relative to a starting end of the second coupler waveguide so that light coupled by the grating structure from the first coupler waveguide into the second coupler waveguide is substantially in phase with light injected into the starting end of the second coupler waveguide when passing light into a starting end of the first coupler waveguide.

31. A method as recited in claim 30, further comprising forming a first input/output (i/o) waveguide coupled to the starting end of the first coupler waveguide.

32. A method as recited in claim 31, wherein the first i/o waveguide is an active waveguide.

33. A method as recited in claim 30, further comprising forming a reflecting structure having a reflector waveguide optically coupled to a second end of the second coupler waveguide, to reflect light propagating from the second coupler waveguide.

34. A method as recited in claim 33, further comprising forming an active waveguide coupled at a first end as the i/o waveguide to the first coupler waveguide.

35. A method as recited in claim 34, further comprising forming an output coupler disposed to reflect light from a second end of the active waveguide.

36. A method as recited in claim 35, further comprising forming a phase control section between the output coupler and the reflecting structure.

37. A method as recited in claim 30, wherein the periodic structure has a period, P, and forming the grating structure includes setting the starting end of the periodic structure within 0.25P of an optimum position where light coupled by the grating structure into the second coupler waveguide is exactly in phase with the light injected into the starting end of the second coupler waveguide.

38. A method as recited in claim 37, wherein the grating structure further includes a lead-in section having a starting end at approximately the same position along the coupler as the starting end of the second coupler waveguide.

39. A method as recited in claim 30, wherein forming the grating structure includes disposing portions of material having a relatively high refractive index in a material having a relatively low refractive index.

40. A method as recited in claim 30, wherein forming the grating structure includes disposing portions of material having a relatively low refractive index in a material having a relatively high refractive index.

41. A method as recited in claim 30, further comprising forming an input/output waveguide before forming the first waveguide, growing a cover layer over the input/output waveguide, etching at least an end of the input waveguide, and growing the first and second coupler waveguides having started ends positioned along the coupler at the etched end of the input/output waveguide.

42. A method as recited in claim 41, wherein forming the starting end of the second coupler waveguide includes removing a portion of the second coupler waveguide proximate the etched end of the input waveguide.

* * * * *

UNITED STATES PATENT AND TRADEMARK OFFICE
CERTIFICATE OF CORRECTION

PATENT NO. : 6,763,165 B1  Page 1 of 1
APPLICATION NO. : 10/050329
DATED : July 13, 2004
INVENTOR(S) : Wesstrom et al.

It is certified that error appears in the above-identified patent and that said Letters Patent is hereby corrected as shown below:

At Claim 8, Column 17, Line 32, please remove the first occurrence of "an"

At Claim 41, Column 20, Line 42, please replace "started" with -- starting --

Signed and Sealed this

Fourth Day of December, 2007

JON W. DUDAS
*Director of the United States Patent and Trademark Office*